US012777953B2

(12) United States Patent
Jung

(10) Patent No.: US 12,777,953 B2
(45) Date of Patent: Oct. 27, 2026

(54) SEMICONDUCTOR PACKAGE

(71) Applicant: Samsung Electronics Co., Ltd., Suwon-si (KR)

(72) Inventor: Jae-Min Jung, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 266 days.

(21) Appl. No.: 18/515,441

(22) Filed: Nov. 21, 2023

(65) Prior Publication Data

US 2024/0421056 A1 Dec. 19, 2024

(30) Foreign Application Priority Data

Jun. 19, 2023 (KR) ........................ 10-2023-0078173

(51) Int. Cl.

| | |
|---|---|
| ***H10W 70/00*** | (2026.01) |
| ***H10W 70/685*** | (2026.01) |
| ***H10W 90/00*** | (2026.01) |
| *H10W 72/00* | (2026.01) |
| *H10W 72/90* | (2026.01) |
| *H10W 74/10* | (2026.01) |
| *H10W 80/00* | (2026.01) |

(52) U.S. Cl.

CPC ......... *H10W 70/685* (2026.01); *H10W 90/00* (2026.01); *H10W 72/01* (2026.01); *H10W 72/9415* (2026.01); *H10W 74/142* (2026.01); *H10W 80/743* (2026.01); *H10W 90/722* (2026.01); *H10W 90/724* (2026.01); *H10W 90/792* (2026.01)

(58) Field of Classification Search

CPC ... H10W 70/60; H10W 70/68; H10W 70/681; H10W 70/682; H10W 70/685; H10W 90/701; H10W 90/721; H10W 90/722; H10W 90/724

See application file for complete search history.

(56) References Cited

U.S. PATENT DOCUMENTS

| | | | | |
|---|---|---|---|---|
| 6,054,755 | A * | 4/2000 | Takamichi | ............ H01L 23/564 257/667 |
| 7,994,871 | B2 | 8/2011 | Chen et al. | |
| 9,961,762 | B2 | 5/2018 | Shin et al. | |
| 2006/0274252 | A1 | 12/2006 | Son | |

(Continued)

FOREIGN PATENT DOCUMENTS

| | | | |
|---|---|---|---|
| JP | H11260958 | A | 9/1999 |
| KR | 20090053001 | A | 5/2009 |

(Continued)

*Primary Examiner* — Reema Patel

(74) *Attorney, Agent, or Firm* — Wolf, Greenfield & Sacks, P.C.

(57) ABSTRACT

A semiconductor package includes: a substrate including a chip region and an edge region extending around the chip region; a plurality of film wirings on the substrate in the chip region; an input wiring and an output wiring on the substrate in the edge region and extending to the chip region in a direction parallel to an upper surface of the substrate; and a semiconductor chip on the substrate in the chip region and electrically connected to the input wiring and the output wiring. The substrate includes a through hole extending through the substrate in a second direction perpendicular to the first direction, and the through hole is between the film wirings.

18 Claims, 18 Drawing Sheets

(56) References Cited

U.S. PATENT DOCUMENTS

| | | | | |
|---|---|---|---|---|
| 2009/0322441 | A1 | 12/2009 | Chen et al. | |
| 2017/0208679 | A1 | 7/2017 | Shin et al. | |
| 2020/0273804 | A1 * | 8/2020 | Jeon | H01L 21/6835 |
| 2022/0415809 | A1 * | 12/2022 | Kim | H01L 23/5385 |

FOREIGN PATENT DOCUMENTS

| | | | |
|---|---|---|---|
| KR | 20110039127 | A | 4/2011 |
| KR | 101183184 | B1 | 9/2012 |

* cited by examiner

100_1

SEMICONDUCTOR PACKAGE

CROSS-REFERENCE TO RELATED APPLICATION

This application claims priority under 35 U.S.C. § 119 to, and the benefit of, Korean Patent Application No. 10-2023-0078173 filed in the Korean Intellectual Property Office on Jun. 19, 2023, the entire contents of which are incorporated herein by reference.

BACKGROUND

The present disclosure relates to a semiconductor package.

In order to cope with the recent trend of miniaturization, thinning, and lightening of electronic products, as a high-density semiconductor chip mounting technology, a chip-on-film (COF) package technology using a flexible film substrate has been proposed. The COF package technology is attracting attention as a high-integration package technology because a semiconductor chip can be directly bonded to the film substrate by a flip-chip bonding method, can be connected to an external circuit through short leads, and can form a dense wiring pattern.

SUMMARY

The present disclosure provides a semiconductor package with improved reliability and productivity.

According to an embodiment, a semiconductor package includes: a substrate including a chip region (i.e., active region) and an edge region extending around the chip region; a plurality of film wirings on the substrate in the chip region; an input wiring and an output wiring on the substrate in the edge region and extending to the chip region in a first direction parallel to an upper surface of the substrate; and a semiconductor chip on the substrate in the chip region and electrically connected to the input wiring and the output wiring, the substrate includes at least one through hole extending through the substrate in a second direction perpendicular to the first direction, and the at least one through hole is located between the plurality of film wirings.

According to another embodiment, a semiconductor package includes: a substrate including a chip region and an edge region extending around the chip region; a plurality of film wirings on the substrate in the chip region; an input wiring and an output wiring on the substrate in the edge region and extending to the chip region in a first direction parallel to an upper surface of the substrate; a semiconductor chip on the substrate in the chip region and electrically connected to the input wiring and the output wiring; and an under-fill layer between the substrate and the semiconductor chip, the substrate includes a plurality of through holes extending through the substrate in a second direction perpendicular to the first direction, the plurality of through holes are between the plurality of film wirings, and the under-fill layer at least partially fills the plurality of through holes.

According to still another embodiment, a semiconductor package includes: a substrate including a chip region and an edge region extending around the chip region; a plurality of film wirings on the substrate in the chip region; an input wiring and an output wiring on the substrate in the edge region and extending to the chip region in a first direction parallel to an upper surface of the substrate; a passivation layer on at least a portion of the input wiring and the output wiring; a semiconductor chip on the substrate in the chip region; a plurality of conductive bumps between the substrate and the semiconductor chip and electrically connecting the input wiring and the output wiring to the semiconductor chip; and an under-fill layer at least partially filling a gap region between the substrate and the semiconductor chip, the substrate includes a plurality of through holes extending through the substrate in a second direction perpendicular to the first direction, the plurality of through holes are located between the film wirings, a width of each of the plurality of through holes in the first direction decreases from the upper surface of the substrate to a lower surface of the substrate, and the under-fill layer is in each of the plurality of through holes.

According to embodiments, by forming a through hole penetrating through a substrate between a plurality of conductive patterns, it is possible to suppress voids from being formed in an under-fill layer in a process of forming the under-fill layer between the substrate and a semiconductor chip, thereby increasing the degree of integration of a conductive pattern.

DETAILED DESCRIPTION

Figure 1:
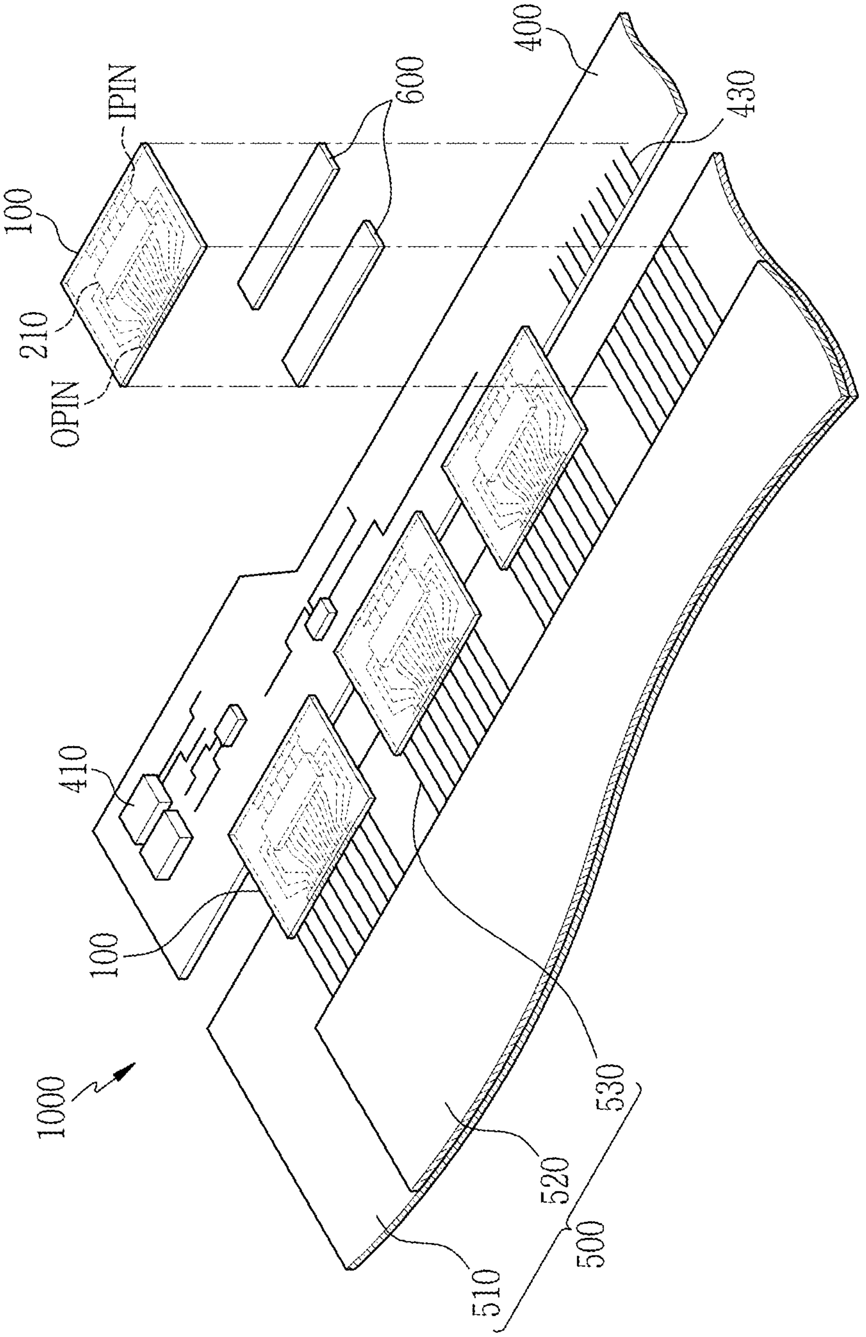
FIG. 1 is a perspective view schematically illustrating a display device including a semiconductor package according to an embodiment.

Hereinafter, embodiments will be described in detail with reference to the accompanying drawings so that those skilled in the art to which the invention pertains may easily practice the invention. However, the invention may be implemented in various different forms and is not limited to embodiments provided herein.

Portions unrelated to the description will be omitted in order to more clearly describe embodiments of the invention, and similar components will be denoted by the same or similar reference numerals throughout the present specification and the several views of the accompanying drawings.

In addition, the size and thickness of each component illustrated in the drawings may be arbitrarily indicated for convenience of description, and the invention is not necessarily limited to the illustrated dimensions. In the drawings, the thickness of layers, films, panels, regions, etc., may be exaggerated for clarity. In addition, in the accompanying drawings, thicknesses of some of the layers and regions have been exaggerated for clarity and convenience of explanation.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, when an element is referred to as being "on" a reference element, it can be positioned on or beneath the reference element, and is not necessarily positioned on the reference element in an opposite direction to gravity.

In addition, unless explicitly described to the contrary, the word "comprise", and variations such as "comprises" or "comprising", will be understood to imply the inclusion of stated elements but not the exclusion of any other elements.

Further, throughout the specification, the word "plan view" refers to a view when a target is viewed from the top (i.e., viewing a horizontal surface of the target from above), and the word "cross-sectional view" refers to a view when a cross section of a target taken along a vertical direction is viewed from the side.

Figure 2:
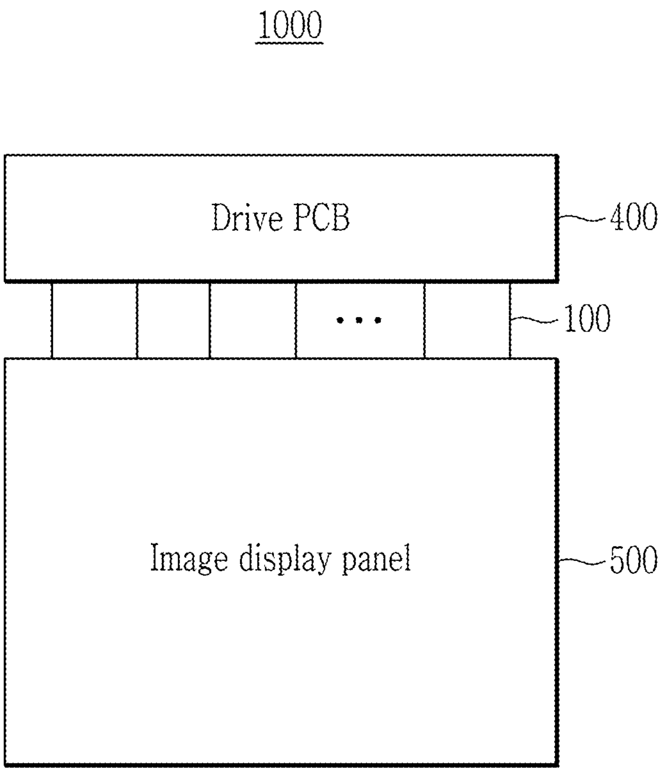
FIG. 2 is a block diagram schematically illustrating a display device including the semiconductor package according to the embodiment.

FIG. 1 is a perspective view schematically illustrating an example display device 1000 including a semiconductor package according to an embodiment of the inventive concept. FIG. 2 is a block diagram schematically illustrating the example display device 1000 shown in FIG. 1 including the semiconductor package according to the embodiment.

Referring to FIGS. 1 and 2, the display device 1000 may include at least one semiconductor package 100, a printed circuit board 400 (e.g., a drive PCB), and an image display panel 500. The semiconductor package 100 may be connected between the printed circuit board 400 and the image display panel 500. The term "connected," as may be used herein, is broadly intended to include an electrical and/or physical connection, and may include other intervening elements. The semiconductor package 100 may receive a signal output from the printed circuit board 400 and transmit the received signal to the image display panel 500.

The semiconductor package 100 according to an embodiment may include, a film-type semiconductor package 100, and/or a chip-on-film (COF) semiconductor package 100. For example, the semiconductor package 100 may be a display driver IC (DDI) package including a semiconductor chip 210 that is a display driver IC. However, the present disclosure is not limited thereto, and the type of semiconductor package 100 may be variously changed. Hereinafter, it is assumed that the semiconductor package 100 is a chip-on-film semiconductor package 100.

The semiconductor package 100 may be, for example, a display driver IC (DDI) package including the semiconductor chip 210 that is the display driver IC (DDI). In some embodiments, when the semiconductor package 100 is used in combination with an electronic device other than the display device 1000, the semiconductor chip 210 may be a semiconductor chip for driving the corresponding electronic device.

One or more driving circuit chips 410 capable of simultaneously applying power and signals to the semiconductor package 100 may be mounted on the printed circuit board 400.

The image display panel 500 may be, for example, a liquid crystal display (LCD) panel, a light emitting diode (LED) panel, an organic LED (OLED) panel, or a plasma display panel (PDP). However, the type of the image display panel 500 is not limited thereto and may be variously changed.

The semiconductor package 100 may be connected to each of a driving connection wiring 430 of the printed circuit board 400 and a panel connection wiring 530 of the image display panel 500.

In some embodiments, one semiconductor package 100 may be connected between the printed circuit board 400 and the image display panel 500. For example, when the image display panel 500 provides a screen of a small area, such as a mobile phone or supports a low resolution, the display device 1000 may include one semiconductor package 100.

In some embodiments, a plurality of semiconductor packages 100 may be connected between the printed circuit board 400 and the image display panel 500. For example, when the image display panel 500 provides a large-area screen like a television or supports high resolution, the display device 1000 may include the plurality of semiconductor packages 100.

The semiconductor package 100 may be connected to one side of the image display panel 500. In some embodiments, one or the plurality of semiconductor packages 100 may be connected to two or more side surfaces of the image display panel 500. For example, when one or the plurality of semiconductor packages 100 are connected to two sides of the image display panel 500 connected to each other, the semiconductor package 100 connected to a first side of the image display panel 500 may be connected to gate lines of the image display panel 500 to perform a function of a gate driver, and the semiconductor package 100 connected to a second side of the image display panel 500 may be connected to source lines of the image display panel 500 to perform a function of a source driver.

The image display panel 500 may include a transparent substrate 510, an image region 520 formed on the transparent substrate 510, and a plurality of panel connection wirings 530. The transparent substrate 510 may be, for example, a glass substrate or a transparent flexible substrate. However, the type of the transparent substrate 510 is not limited thereto and may be variously changed.

A plurality of pixels located in the image region 520 may be connected to the plurality of panel connection wirings 530 and operated according to signals provided by the semiconductor chip 210 located in the semiconductor package 100.

The semiconductor package 100 may have an input pin IPIN formed at one end and an output pin OPIN formed at another end of the semiconductor package 100, although embodiments of the inventive concept are not limited to any specific arrangement of the input and output pins IPIN, OPIN. The input pin IPIN and the output pin OPIN may each be connected to the driving connection wiring 430 of the printed circuit board 400 and the panel connection wiring 530 of the image display panel 500 by an anisotropic conductive layer 600.

The anisotropic conductive layer 600 may be, for example, an anisotropic conductive film or an anisotropic conductive paste. The anisotropic conductive layer 600 may have a structure in which conductive particles are dispersed in an insulating adhesive layer, and may have anisotropic electric characteristics that it is conducted only in an electrode direction, that is, in a vertical direction and is insulated in a direction between electrodes, that is, in a horizontal direction, when connected.

In one or more embodiments, by applying heat and pressure to the anisotropic conductive layer 600, the insulating adhesive layer will melt such that the conductive particles may be arranged between the opposing electrodes (for example, between the input pin IPIN and the driving connection wiring 430 or between the output pin OPIN and the panel connection wire 530) to form an electrical connection therebetween, while the insulating adhesive layer will remain between adjacent electrodes thereby insulating the adjacent electrodes from each other.

Figure 3:
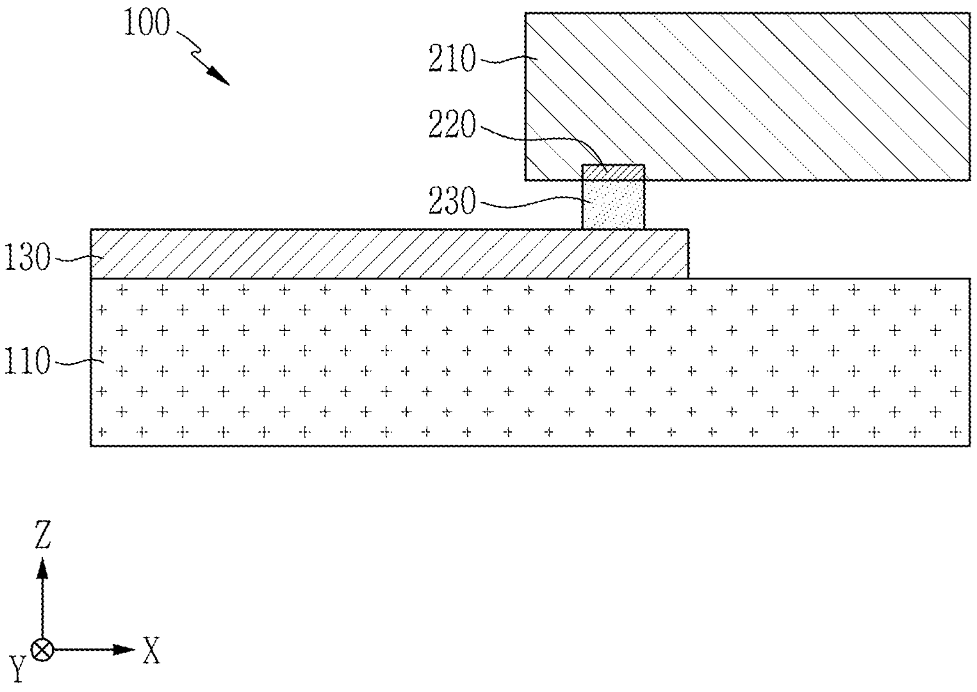
FIG. 3 is a side view schematically illustrating a portion of the semiconductor package of FIGS. 1 and 2.

FIG. 3 is a side view schematically illustrating a portion of the semiconductor package 100 of FIGS. 1 and 2.

The semiconductor package 100 may include a film substrate 110 and a conductive pattern 130 (or a lead) located on the film substrate 110.

The semiconductor package 100 may include the semiconductor chip 210 including at least one pad 220 on a first surface of the semiconductor chip 210 facing the film substrate 110 and a conductive bump 230 located on the pad 220 of the semiconductor chip 210 electrically connecting the semiconductor chip 210 to the conductive pattern 130. The pad 220 may include, for example, copper (Cu) or aluminum (Al). The bump 230 may include, for example, gold (Au). However, the materials included in the pad 220 and the bump 230 are not limited thereto and may be variously changed.

The conductive pattern 130 located on the film substrate 110 may be in contact with the bump 230 located on the pad 220 located on the first surface of the semiconductor chip 210; that is, the bump 230 may be between the conductive pattern 130 and the pad 220.

The pad 220 may be buried in the first surface of the semiconductor chip 210 facing the conductive pattern 130. That is, a first surface of the pad 220 facing the conductive pattern 130 may be located at substantially the same level as the first surface of the semiconductor chip 210 facing the conductive pattern 130 (i.e., coplanar), and a second surface of the pad 220, opposite the first surface, may be located at a level between the first surface of the semiconductor chip 210 and a second surface of the semiconductor chip 210 opposite the first surface.

The bump 230 may protrude (i.e., extend) toward the conductive pattern 130 from the first surface of the semiconductor chip 210 facing the conductive pattern 130 to a predetermined thickness in a Z-axis direction, perpendicular to the first surface of the semiconductor chip 210. The bump 230 may be located at a circumferential portion or a central portion of the semiconductor chip 210. However, the location of the bump 230 is not limited thereto, and may be located in various portions of the semiconductor chip 210.

Accordingly, the semiconductor chip 210 and the conductive pattern 130 are electrically connected through the bump 230 formed on the first surface of the semiconductor chip 210, and the conductive pattern 130 may be electrically connected to input/output pins (not illustrated) on the film substrate 110.

In FIG. 3, only one pad 220 and one bump 230 of the semiconductor chip 210 are illustrated for convenience, but it is to be appreciated that a plurality of pads 220 and a plurality of corresponding bumps 230 of semiconductor chip 210 may be formed.

Figure 4:
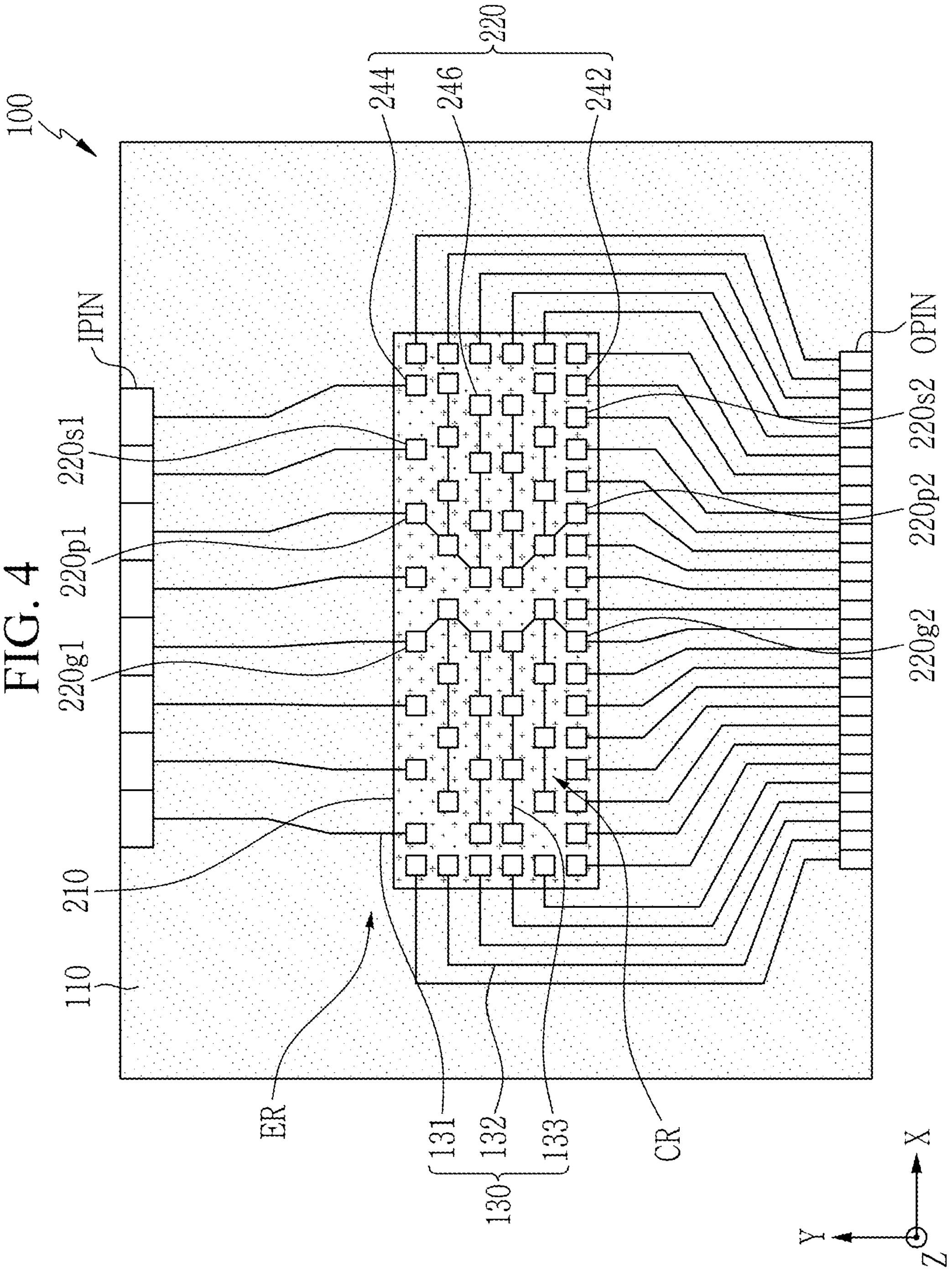
FIG. 4 is a plan view schematically illustrating the semiconductor package according to the embodiment.

FIG. 4 is a plan view schematically illustrating the semiconductor package 100 of FIGS. 1 and 2, according to the embodiment.

Figure 5:
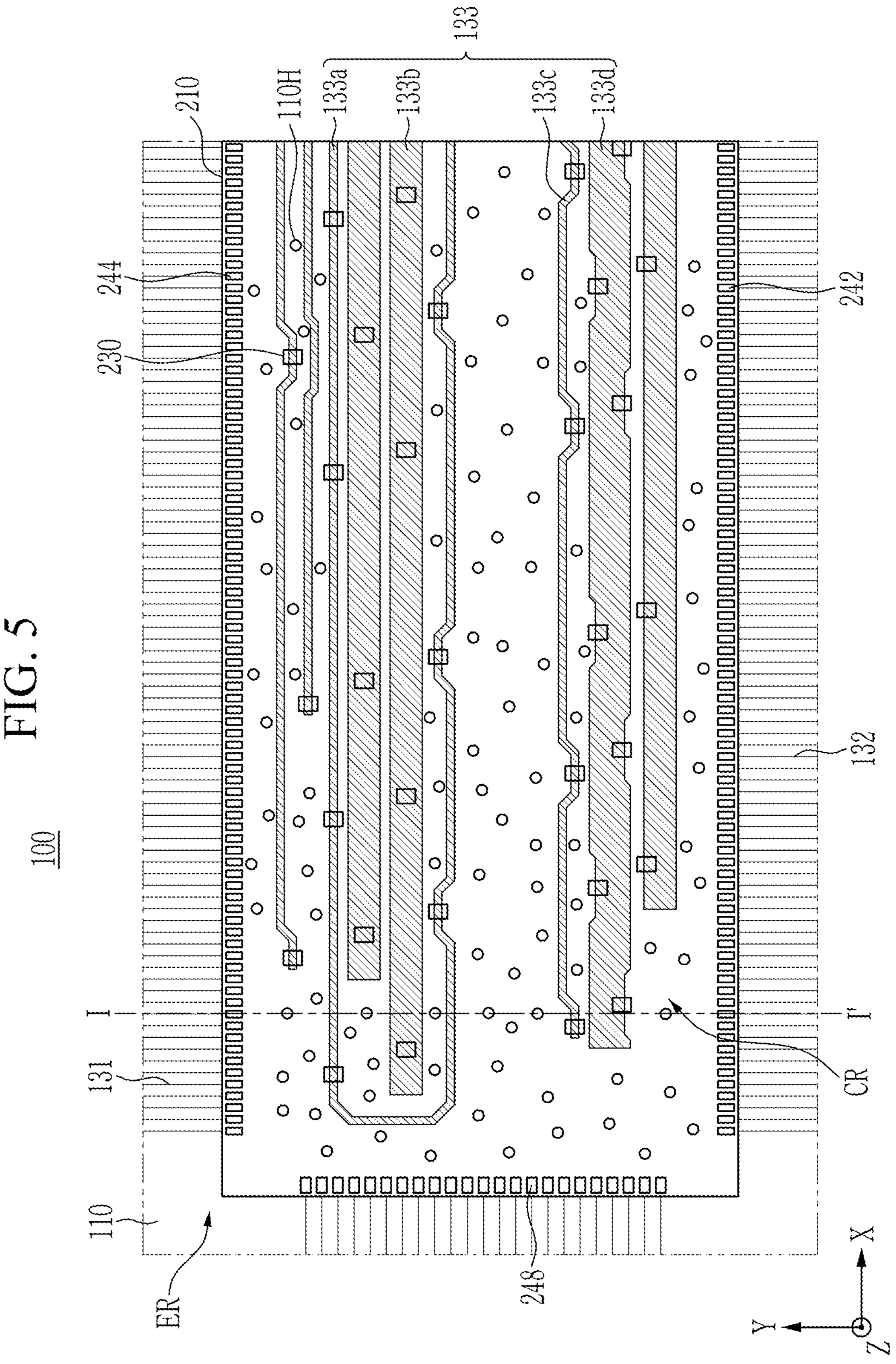
FIG. 5 is a partially enlarged view of a portion of the semiconductor package illustrated in FIG. 4.
Figure 6:
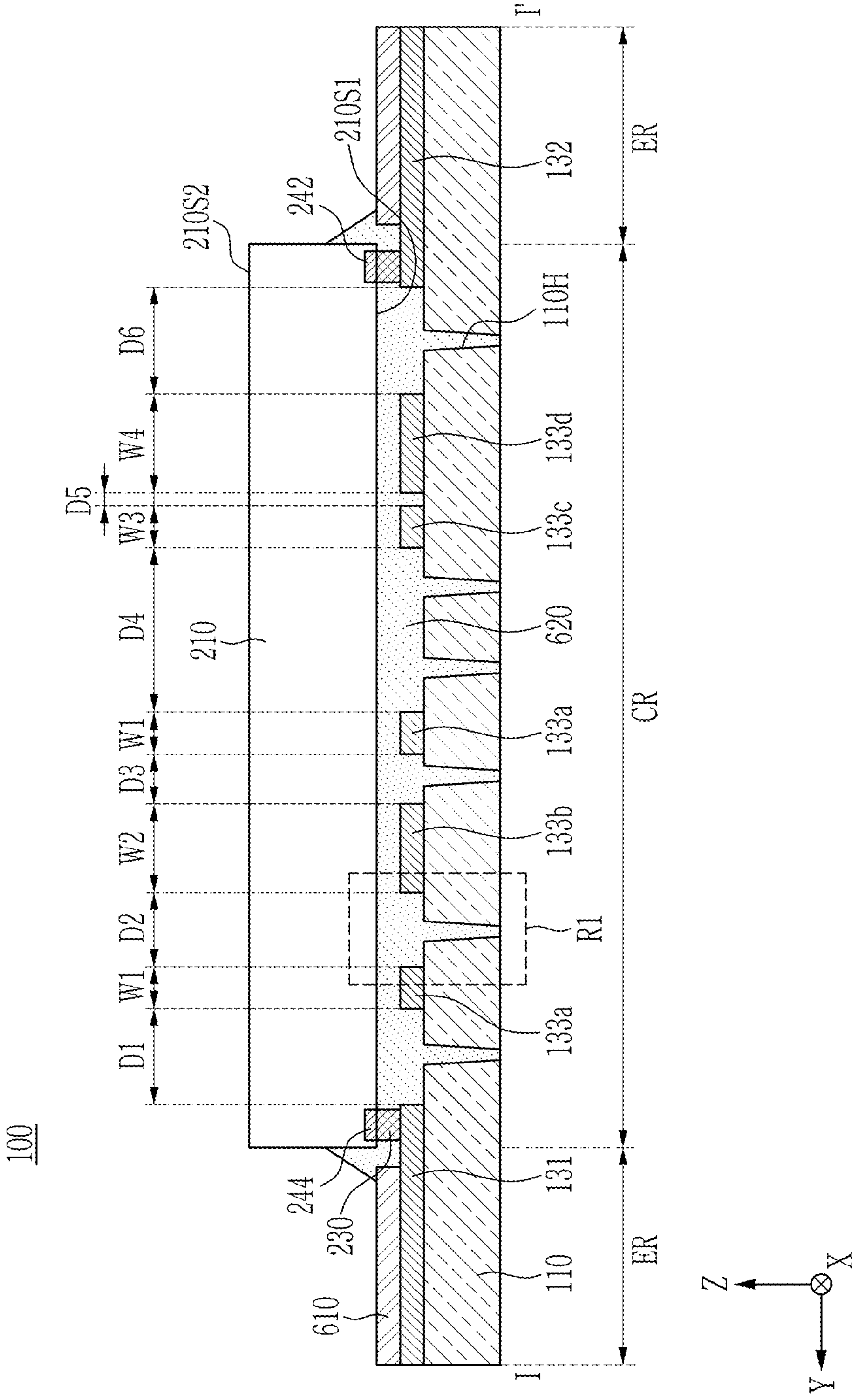
FIG. 6 is a cross-sectional view taken along line I-I' of FIG. 5.
Figure 7:
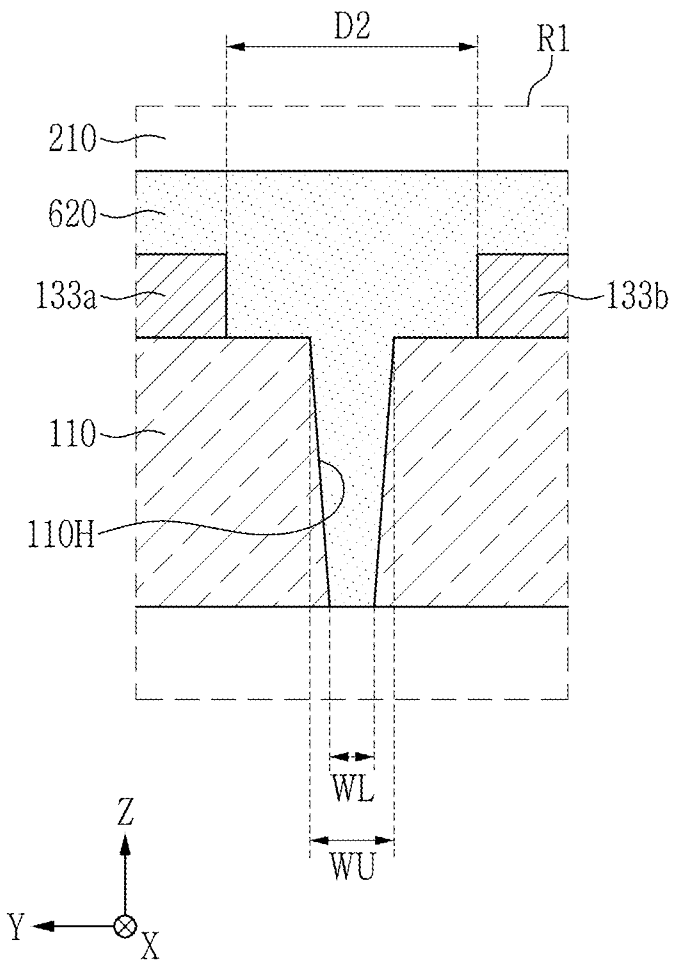
FIG. 7 is a partially enlarged view of area R1 of FIG. 6.

FIG. 5 is a partially enlarged plan view of a portion of the semiconductor package 100 illustrated in FIG. 4. FIG. 6 is a cross-sectional view taken along line I-I' of FIG. 5. FIG. 7 is a partially enlarged cross-sectional view of an area R1 of the semiconductor package 100 shown in FIG. 6.

Specifically, in FIGS. 4 to 6, the same reference numerals as those depicted in FIGS. 1 to 3 denote the same configuration, and in FIG. 4, for convenience, a bump (referred to as '230' in FIG. 3) formed on the pad 220 is omitted for clarity. FIG. 4 illustrates that the pad 220 is located on the first surface of the semiconductor chip 210 facing the film substrate 110.

FIG. 5 is a partially enlarged view of a chip region CR and an edge region ER of the film substrate 110 illustrated in FIG. 4. For convenience of description, center pads 246 located at the central portion of the semiconductor chip 210 are not illustrated in FIG. 5.

In FIGS. 4 and 5, the conductive pattern 130 located in the chip region CR of the film substrate 110 on which the semiconductor chip 210 is located is illustrated as an example, but is not limited thereto and may be variously changed according to the design.

Referring to FIGS. 4 to 7, as described above, the semiconductor package 100 may include the film substrate 110, the conductive pattern 130, the semiconductor chip 210, the pad 220, and the bump 230. In addition, the semiconductor package 100 may include the output pin OPIN and the input pin IPIN located on one surface (e.g., upper surface) of the film substrate 110.

The film substrate 110 may be a flexible substrate. The film substrate 110 may include an insulating material. For example, it may be a resin-based material made of polyimide, polyester, or other known material, and may have flexibility. However, the materials included in the pad 110 and the bump 230 are not limited thereto and may be variously changed.

The film substrate 110 may include the chip region CR and the edge region ER. The chip region CR may be a region to which the semiconductor chip 210 is attached (i.e., an active region), and the edge region ER may be a region surrounding the chip region CR. The term "surrounding" (or "surround," or like terms) as used herein is intended to broadly refer to an element, structure or layer that extends around, envelops, encircles, or encloses another element, structure or layer on all sides, although breaks or gaps may also be present. Thus, for example, a material layer having voids therein may still "surround" another layer which it encircles.

The film substrate 110 may include a through hole 110H penetrating through (i.e., extending into) the film substrate 110 in a vertical direction (i.e., Z-axis direction) and located between film wirings 133 to be described later. In an embodiment, the film substrate 110 may include the plurality of through holes 110H. A detailed description of the through hole 110H will be described later.

The conductive pattern 130 may include, for example, copper (Cu) or aluminum (Al). However, the material included in the conductive pattern 130 is not limited thereto and may be variously changed.

The conductive pattern 130 may be located on only one surface (e.g., front surface) of the film substrate 110 or may be located on opposing surfaces (e.g., front and back surfaces) of the film substrate 110. In some embodiments, when the conductive pattern 130 is located on both one side and the other side (i.e., opposing surfaces) of the film substrate 110, the semiconductor package 100 penetrates through (i.e., extend into) the film substrate 110 and may further include conductive vias (not illustrated) that penetrate through (i.e., extend into) the film substrate 110 and electrically connect between the conductive patterns 130 each formed on both surfaces of the film substrate 110.

Specifically, the conductive pattern 130 may include an input wiring 131 extending from the edge region ER to the chip region CR (e.g., in an X-axis and/or Y-axis direction) and electrically connecting the input pin IPIN and the pads 220, an output wiring 132 extending from the edge region ER to the chip region CR (e.g., in the X-axis and/or Y-axis direction) and connecting the output pin OPIN and the pads 220, and a film wiring 133 located in the chip region CR and connected to the pads 220.

The input wiring 131 and the output wiring 132 may be electrically separated from each other and may extend in different directions. First ends of the input wiring 131 and the output wiring 132 may each be connected to the semiconductor chip 210, and second ends thereof may each be connected to the input pin IPIN and the output pin OPIN.

The film wiring 133 may be located at substantially the same level as the input wiring 131 and the output wiring 132 in the chip region CR of the film substrate 110. The film wiring 133 may be wiring that contacts the center pads 246 located at the central portion of the semiconductor chip 210 and applies power thereto.

The film wirings 133 may extend in a first direction X from the chip region CR of the film substrate 110 in plan view and have a certain width in a second direction Y intersecting the first direction X.

In an embodiment, as illustrated in FIG. 5, at least some of the film wirings 133 may have different widths, and an interval between adjacent pairs of the film wirings 133 spaced apart in the second direction Y may be different. Also, the film wirings 133 extending along the first direction X may have different lengths.

For example, the film wiring 133 may include a first film wirings 133*a*, a second film wiring 133*b*, a third film wirings 133*c*, and a fourth film wiring 133*d* spaced apart from each other in the second direction Y.

Specifically, the first film wiring 133*a* may extend in the first direction X in plan view and surround at least a portion of the second film wiring 133*b*, also extending in the first direction X, the first and second film wirings 133*a*, 133*b* being spaced apart from each other in the second direction Y. That is, the first film wiring 133*a* may extend further in the first direction X than the second film wiring 133*b*, and the first film wiring 133*a* may surround at least a portion of one side, the other side, and an end portion of the second film wiring 133*b* in plan view.

The third film wiring 133*c* may extend in the first direction X parallel to the first film wiring 133*a* and the second film wiring 133*b*. The third film wiring 133*c* may be located on one side and the other side of the first film wiring 133*a*, respectively. The third film wiring 133*c* may be spaced apart from the first film wiring 133*a* in the second direction Y. The third film wiring 133*c* may be spaced apart from the second film wiring 133*b* in the second direction Y with the first film wiring 133*a* interposed therebetween.

The fourth film wiring 133*d* may extend parallel to the first film wiring 133*a*, the second film wiring 133*b*, and the third film wiring 133*c* in the first direction X.

The fourth film wiring 133*d* may be located between the second film wiring 133*b* and the third film wiring 133*c*. The fourth film wiring 133*d* may be spaced apart from the second film wiring 133*b* and the third film wiring 133*c* in the second direction Y. The second film wiring 133*b* may be spaced apart from the third film wiring 133*c* in the second direction Y with the fourth film wiring 133*d* interposed therebetween.

In an embodiment, the lengths of the first film wiring 133*a*, the second film wiring 133*b*, the third film wiring 133*c*, and the fourth film wiring 133*d* extending in the first direction X, respectively, may be different.

In addition, in an embodiment, each of the first film wiring 133*a*, the second film wiring 133*b*, the third film wiring 133*c*, and the fourth film wiring 133*d* may each include a plurality of wirings, and the lengths of each of the plurality of wirings extending in the first direction X may be different. For example, the lengths of the plurality of second film wirings 133*b* and the third film wirings 133*c* extending in the first direction X may be different.

Referring to FIGS. 5 and 6, in an embodiment, the first film wiring 133*a*, the second film wiring 133*b*, the third film wiring 133*c*, and the fourth film wiring 133*d* may each have a first width W1, a second width W2, a third width W3, and a fourth width W4, respectively, in the second direction Y.

In an embodiment, one or more of the first width W1, the second width W2, the third width W3, and the fourth width W4 may be different relative to one another. For example, the first width W1 may be smaller than the second width W2 and the fourth width W4 and may be substantially equal to the third width W3. The second width W2 may be smaller than or substantially the same as the fourth width W4. Embodiments of the inventive concept are not limited to any values of widths W1, W2, W3 and W4.

In an embodiment, as the lengths of the first film wiring 133*a*, the second film wiring 133*b*, the third film wiring 133*c*, and the fourth film wiring 133*d* along the first direction X, and the widths of the first film wiring 133*a*, the second film wiring 133*b*, the third film wiring 133*c*, and the fourth film wiring 133*d* along the second direction Y are different, a separation distance between the first film wiring 133*a*, the second film wiring 133*b*, the third film wiring 133*c*, and the fourth film wiring 133*d* located in the chip region CR of the film substrate 110 may be different. Accordingly, areas between the first film wiring 133*a*, the second film wiring 133*b*, the third film wiring 133*c*, and the fourth film wiring 133*d* may be different.

In addition, the interval (i.e., spacing) between the input wiring 131 and the film wiring 133, the interval between the output wiring 132 and the film wiring 133, and the separation distance between the film wirings 133 may be different.

For example, the separation distance between the input wiring 131 and the first film wiring 133*a* in the second direction Y may have a first distance D1. The separation distance between the first film wiring 133*a* and the second film wiring 133*b* located on one side of the first film wiring 133*a* in the second direction Y may have a second distance D2. The separation distance between the first film wiring 133*a* and the second film wiring 133*b* located on the other side of the first film wiring 133*a* in the second direction Y may have a third distance D3. The separation distance between the first film wiring 133*a* and the third film wiring 133*c* located on the other side of the second film wiring 133*b* in the second direction Y may have a fourth distance D4. The separation distance between the third film wiring 133*c* and the fourth film wiring 133*d* in the second direction Y may have a fifth distance D5. The separation distance between the output wiring 132 and the fourth film wiring 133*d* in the second direction Y may have a sixth distance D6.

Here, the first distance D1 to the sixth distance D6 is intended to refer to a straight line distance between the wirings along the second direction Y, and the second distance D2 to the fifth distance D5 means the separation distance in the second direction Y between some of the plurality of film wirings 133 located in the chip region CR, and the separation distance between the rest of the plurality of film wirings 133 located in the chip region CR may be different from the above-described distances D2, D3, D4, and D5.

In an embodiment, the first distance D1 to the sixth distance D6 may be different from each other. For example, the fourth distance D4 may be the largest and the fifth distance D5 may be the smallest. Accordingly, the area between the first film wiring 133*a* and the third film wiring 133*c* located on the other side of the second film wiring 133*b* in the second direction Y may be the largest, and the area between the third film wiring 133*c* and the fourth film wiring 133*d* may be the smallest.

In an embodiment, the second distance D2 to the fifth distance D5, which is the distance between the film wirings 133, may be about 50 μm to 100 μm. When the separation distance between the film wirings 133 is within the above numerical range, it is possible to suppress voids from occurring in an under-fill layer 620 in the process of forming the under-fill layer 620 between the film wirings 133 to be described later while increasing the degree of integration of the film wirings 133 located in the chip region CR to improve the performance of the semiconductor chip 210. However, the separation distance between the film wirings 133 is not limited to the above numerical range and may be variously changed.

In an embodiment, the film substrate 110 may include a through hole 110H extending through the film substrate 110 in a third direction Z (perpendicular to the first and second directions), which is the vertical direction, and located in the chip region CR of the film substrate 110. The film substrate 110 may include a plurality of through holes 110H, and the plurality of through holes 110H may be located between the plurality of film wirings 133.

FIG. 5 illustrates that the shape of the through holes 110H in plan view may be circular, but the shape of the through holes 110H in plan view is not limited thereto and may be variously changed. For example, the shape of the through holes 110H in plan view may have a polygonal shape such as a quadrangle.

In an embodiment, the number of through holes 110H located between the plurality of film wirings 133 may be different. That is, the number of through holes 110H located between the film wirings 133 having a long separation distance between the film wirings 133 may be more than the number of through holes 110H located between the film wirings 133 having a short separation distance between the film wirings 133. In other words, the number of through holes 110H located in the film substrate 110 having a large area between the film wirings 133 may be more than the number of through holes located in the film substrate 110 having a small area between the film wirings 133.

For example, as the separation distance between the first film wiring 133*a* and the second film wiring 133*b* located on one side of the second film wiring 133*b* in the second direction Y is smaller than the separation distance between the first film wire 133*a* and the second film wire 133*b* located on the other side of the second film wiring 133*b* in the second direction Y, the area between the first film wiring 133*a* and the second film wiring 133*b* located on one side of the second film wiring 133*b* in the second direction Y may be smaller than the area of the first film wiring 133*a* and the second film wiring 133*b* located on the other side of the second film wiring 133*b* in the second direction Y.

Accordingly, the number of through holes 110H located between the first film wiring 133*a* and the second film wiring 133*b* located on one side of the second film wiring 133*b* in the second direction Y may be smaller than the number of through holes 110H between the first film wiring 133*a* and the second film wiring 133*b* located on the other side of the two film wirings 133*b* in the second direction Y.

In addition, the area of the film substrate 110 between the first film wiring 133*a* and the third film wiring 133*c* may be greater than the area of the film substrate 110 between the first film wiring 133*a* and the second film wiring 133*b*. Accordingly, the number of through holes 110H located between the first film wiring 133*a* and the third film wiring 133*c* may be more than the number of through holes 110H located between the first film wiring 133*a* and the second film wiring 133*b*.

In an embodiment, the plurality of through holes 110H may also be located in the chip region CR of the film substrate 110 located outside the end portion and side surfaces of the film wirings 133 as well as the chip region CR of the film substrate 110 located between the film wirings 133. For example, the plurality of through holes 110H may be located between the film substrate 110 located between the input wiring 131 and the plurality of film wirings 133 and the film substrate 110 located between the output wiring 132 and the plurality of film wirings 133.

In addition, as the area of the film substrate 110 located between the input wiring 131 and the film wirings 133 and the area of the film substrate 110 located between the output wiring 132 and the film wirings 133 are each different from the area of the film substrate 110 located between the plurality of film wirings 133, the number of through holes 110H located between the input wiring 131 and the plurality of film wirings 133 and the number of through holes 110H located between the output wiring 132 and the plurality of film wirings 133 may each be different from the number of through holes 110H located between the plurality of film wirings 133.

For example, the number of through holes 110H located between the input wiring 131 and the film wirings 133 and the number of through holes 110H located between the output wiring 132 and the plurality of film wirings 133 may be more than the number of through holes 110H located between the first film wiring 133*a* and the second film wiring 133*b*.

In addition, the number of through holes 110H located between the input wiring 131 and the plurality of film wirings 133 and the number of through holes 110H located between the output wiring 132 and the plurality of film wirings 133 may be smaller than the number of through holes located between the first film wiring 133*a* and the third film wiring 133*c* located on the other side of the second film wiring 133*b*.

Since the conductive pattern 130 located in the chip region CR illustrated in FIG. 5 is an example only, the conductive pattern 130 is not limited thereto and may be variously changed according to the design. That is, the lengths of the film wirings 133 along the first direction X, the widths of the film wirings 133 along the second direction Y, the intervals between adjacent pairs of the film wirings 133, the interval between the input wiring 131 and the film wirings 133, and the interval between the output wiring 132 and the film wirings 133 may be variously changed. Accordingly, the number of through holes 110H located between the film wirings 133, the number of through holes 110H located between the input wiring 131 and the film wirings 133, and the number of through holes 110H located between the output wiring 132 and the film wirings 133 may be variously changed.

Referring to FIG. 7, the width of the through hole 110H in the second direction Y according to an embodiment may decrease from the upper surface to the lower surface of the film substrate 110. That is, the shape of the through hole 110H in cross section may have an inverted trapezoidal shape as the through hole 110H extends through the film substrate 110 in the third direction Z. Accordingly, the through hole 110H may have a forward taper inclined side surface with respect to the film substrate 110 in cross section.

Specifically, the through hole 110H may have a lower width WL located at a level of a lower surface of the film substrate 110 and an upper width WU located at substantially the same level as the upper surface of the film substrate 110, where the lower width WL and the upper width WU of the through hole 110H are measured in the second direction Y. As the width of the through hole 110H decreases from the upper surface to the lower surface, the through hole 110H may have a maximum value at the upper width WU and a minimum value at the lower width WL.

In an embodiment, the ratio of the lower width WL and the upper width WU of the through hole 110H may be about 1:2 to 1:10. For example, the lower width WL may be about 10 μm to 50 μm, and the upper width WU may be about 20 μm to 100 μm. However, the ratio and numerical range of the lower width WL and upper width WU of the through hole 110H are not limited thereto and may be variously changed.

The width of the through hole 110H may be substantially the same as the separation distances D2, D3, D4, and D5 between the film wirings 133 or the width of the through hole 110H may be different (e.g., less than, as shown in FIG. 7) than the separation distances D2 through D5 between the film wirings 133.

Specifically, the separation distances D2, D3, D4, and D5 between the film wirings 133 may be greater than the lower width WL of the through hole 110H and greater than or substantially the same as the upper width WU of the through hole 110H. Accordingly, the through holes 110H are located between the film wirings 133 and may not overlap with the film wirings 133 in the third direction Z, which is the vertical direction. The term "overlap" (or "overlapping," or like terms), as used herein, is intended to broadly refer to a first element that intersects with at least a portion of a second element in the vertical direction (i.e., the third direction Z, perpendicular to the upper surface of the film substrate 110), but does not require that the first and second elements be completely aligned with one another in a horizontal plane (i.e., in the first direction X and/or second direction Y). However, the relationship between the separation distance between the film wirings 133 and the width of the through hole 110H is not limited thereto and may be variously changed.

When the lower width WL and the upper width WU of the through hole 110H have the above numerical range, the through holes 110H may be formed between the film wirings 133 so as not to overlap with the film wirings 133. In addition, in a process of forming the under-fill layer 620 between the film substrate 110 and the semiconductor chip 210, which will be described later, it is possible to effectively remove voids partially formed in the under-fill layer 620 by performing a process of sucking (i.e., evacuating or extracting) air formed in the under-fill layer 620 through the through hole 110H.

The output pin OPIN and the input pin IPIN connected to the input wiring 131 and the output wiring 132, respectively, may be located at a first end and a second end of the film substrate 110 or at a portion adjacent to the first and second ends of the film substrate 110, respectively. The output pin OPIN may be located at one end (i.e., the first end) of the film substrate 110 in the second direction Y, and the input pin IPIN may be located at the other end (i.e., the second end) of the film substrate 110 in the second direction Y.

The input pin IPIN and the output pin OPIN may be a portion of the conductive pattern 130 or a portion plated with tin (Sb), gold (Au), nickel (Ni), or lead (Pb) on a part of the conductive pattern 130. In some embodiments, the input pin IPIN and the output pin OPIN are electrically connected to the conductive pattern 130 and may include a conductive material including a material different from that of the conductive pattern 130.

The semiconductor chip 210 may be located in the chip region CR of the film substrate 110. That is, the semiconductor chip 210 may be attached to the chip region CR located on one surface of the film substrate 110.

The semiconductor chip 210 may include a lower surface 210S1 and an upper surface 210S2 that face each other. As described above, the semiconductor chip 210 may include the plurality of pads 220 in the lower surface 210S1 of the semiconductor chip 210.

In detail, the semiconductor chip 210 may include edge pads 242 and 244 located along the circumference (i.e., periphery) of the semiconductor chip 210 and the center pad 246 located in the central portion of the semiconductor chip 210 (FIG. 4). The edge pads 242 and 244 formed at a circumferential portion of the semiconductor chip 210 may include signal input and output pads 220_s_1 and 220_s_2, input and output power pads 2020_p_1 and 220_p_2, and input and output ground pads 220_g_1 and 220_g_2.

The edge pads 242 and 244 and the center pad 246 may be in contact with the input wiring 131 and the output wiring 132, respectively, through the bump (refer to '230' in FIGS. 2 and 6), and may be electrically connected to the input and output pins IPIN and OPIN. However, it is not limited thereto, and in some embodiments, the edge pads 242 and 244 may be used as dummy pads.

The center pads 246 formed in the central portion of the semiconductor chip 210 may be in contact with the film wirings 133 located in the chip region CR, and may be used as a power pad or a ground pad to improve electrical characteristics of the semiconductor chip 210. However, the arrangement, shape, type, and number of the pads 220 included in the semiconductor chip 210 are not limited thereto and may be variously changed.

A passivation layer 610 may be located over the input wiring 131 and the output wiring 132. The passivation layer 610 may cover at least a portion of upper surfaces of each of the input wiring 131 and the output wiring 132. The term "cover" (or "covers" or "covering," or like terms) as may be used herein is intended to broadly refer to a material, layer or structure being on or over another material, layer or structure, but does not require the material, layer or structure to entirely cover the other material, layer or structure. The passivation layer 610 may include an insulating material, for example, a solder resist material. However, the arrangement and material type of the passivation layer 610 are not limited thereto and may be variously changed.

An under-fill layer 620 may be located between the film substrate 110 and the semiconductor chip 210. The under-fill layer 620 may fill a gap region between the film substrate 110 and the semiconductor chip 210. The term "fill" (or "filling," "filled," or like terms) as may be used herein is intended to refer broadly to either completely filling a defined space (e.g., the gap region between the film substrate 110 and the semiconductor chip 210) or partially filling the defined space; that is, the defined space need not be entirely filled but may, for example, be partially filled or have voids or other spaces throughout. The under-fill layer 620 may be in contact with the lower surface 210S1 of the semiconductor chip 210. The under-fill layer 620 may cover at least a portion of a side surface of the semiconductor chip 210 and at least a portion of the passivation layer 610. The under-fill layer 620 may seal the film wirings 133 and the bumps 230. The under-fill layer 620 may be located in the through holes 110H. That is, the under-fill layer 620 may fill the through holes 110H located in the film substrate 110.

The under-fill layer 620 may include an insulating polymer. For example, the under-fill layer 620 may include an epoxy-based polymer. However, the material included in the under-fill layer 620 is not limited thereto and may be variously changed.

According to the semiconductor package 100 according to an embodiment, even if the degree of integration of the film wirings 133 increases as the number of film wirings 133 and the line width of the film wirings 133 increases in order to improve the performance of the semiconductor chip 210, it is possible to suppress voids from being formed in the under-fill layer 620 located around the film wirings 133 by the plurality of through holes 110H located between the plurality of film wirings 133. Accordingly, it is possible to improve the reliability of the semiconductor package 100 while improving the performance of the semiconductor chip 210.

Hereinafter, another embodiment of a semiconductor package will be described with reference to FIGS. 8 to 11. In the following embodiments, the same reference numerals refer to components identical to those of the previously described embodiments, and redundant descriptions will be omitted or simplified, and the differences will be mainly described.

Figure 8:
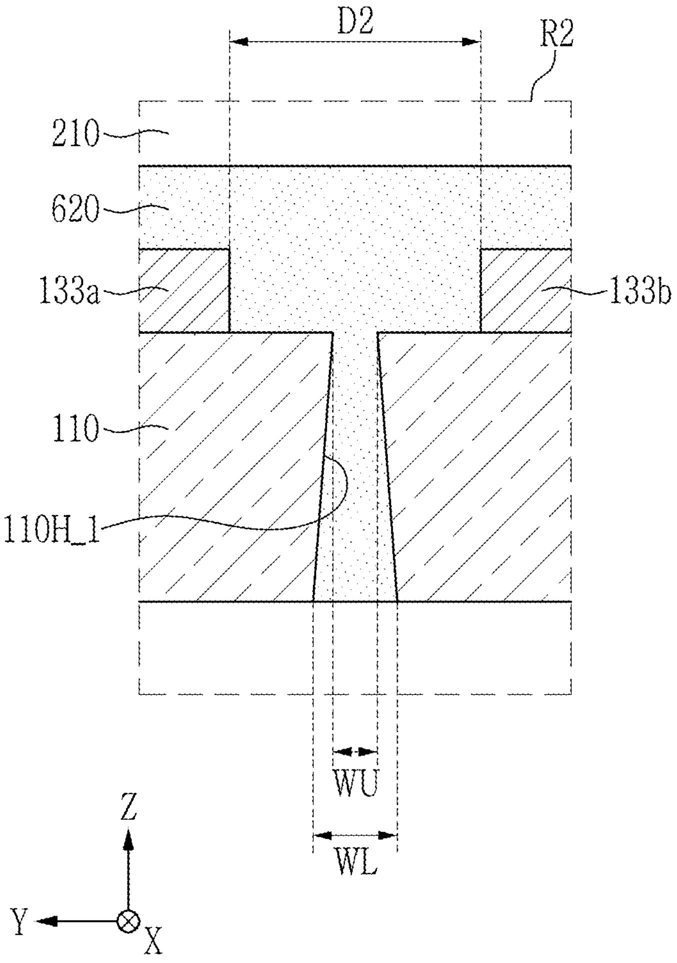
FIGS. 8 and 9 are partially enlarged views illustrating a cross section of the semiconductor package according to some embodiments.
Figure 9:
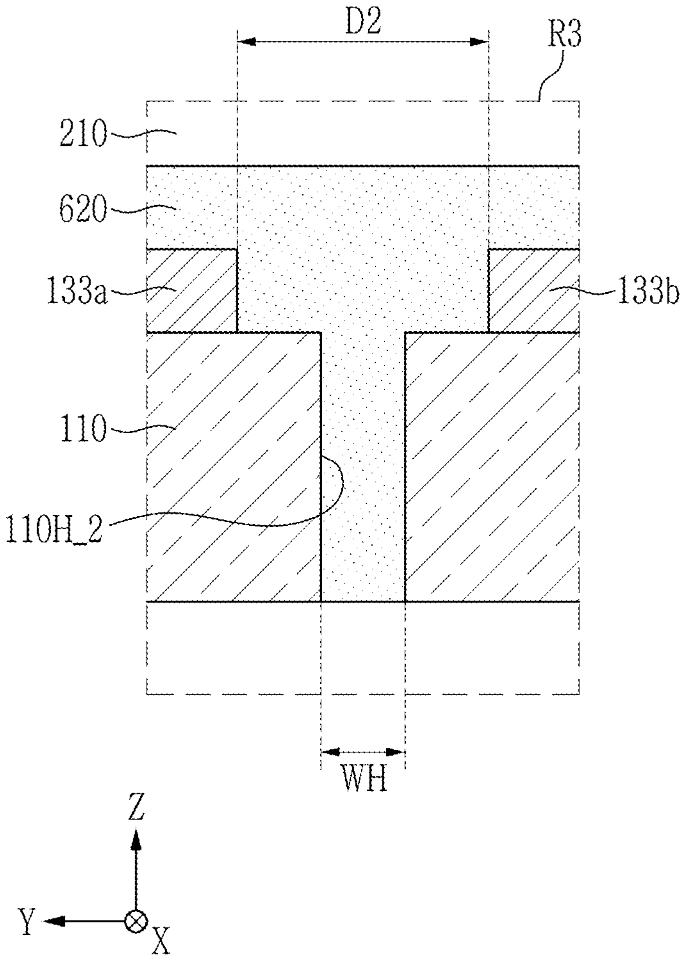

FIGS. 8 and 9 are partially enlarged views illustrating a cross section of the semiconductor package according to some embodiments. FIGS. 8 and 9 illustrate an R2 region and an R3 region, respectively, corresponding to the R1 region of FIG. 6.

According to the embodiments illustrated in FIGS. 8 and 9, there is a difference in that the shape of the through hole 110H in cross section compared to the embodiment illustrated in FIG. 7 is different.

Specifically, referring to FIG. 8, a width of a through hole 110H_1 may increase from the upper surface to the lower surface of the film substrate 110. That is, the shape of the through hole 110H_1 in cross section may have a trapezoidal shape. Accordingly, the through hole 110H_1 may have a reverse taper inclined side surface with respect to the film substrate 110 in cross section.

Specifically, the through hole 110H_1 may have the lower width WL located at substantially the same level as the lower surface of the film substrate 110 and the upper width WU located at substantially the same level as the upper surface of the film substrate 110. As the width of the through hole 110H_1 increases from the upper surface to the lower surface, the width of the through hole 110H_1 may have a minimum value at the upper width WU and a maximum value at the lower width WL.

In this embodiment, the ratio of the upper width WU to the lower width WL of the through hole 110H may be about 1:2 to 1:10. For example, the upper width WU may be about 10 μm to 50 μm, and the lower width WU may be about 20 μm to 100 μm. However, the ratio and numerical range of the lower width WL and the upper width WU of the through hole 110H_1 are not limited thereto and may be variously changed.

In this embodiment, the width of the through hole 110H_1 may be substantially the same as the above-described separation distances D2, D3, D4, and D5 between the film wirings 133 or may be smaller than the separation distance D2, D3, D4, and D5 between the film wirings 133.

Specifically, the separation distances D2, D3, D4, and D5 between the film wirings 133 may be greater than the upper width WU of the through hole 110H_1 and greater than or substantially the same as the lower width WL of the through hole 110H. However, the relationship between the separation distance between the film wirings 133 and the width of the through hole 110H_1 is not limited thereto and may be variously changed.

Referring to FIG. 9, a width WH of the through hole 110H_2 may have a constant width, unlike the through holes 110H and 110H_1 illustrated in FIGS. 7 and 8. That is, a shape of a through hole 110H_2 in cross section may have a quadrangular shape; that is, the width of the through hole 110H_2 at the upper surface of the film substrate 110 may be substantially the same as the width of the through hole 110H_2 at the lower surface of the film substrate 110 (i.e., substantially vertical sidewalls). Accordingly, the through hole 110H_2 may have a side surface perpendicular to the third direction Z with respect to the film substrate 110 in cross section.

In this embodiment, the width WH of the through hole 110H_2 may be about 10 μm to 100 μm. However, the numerical range of the width WH of the through hole 110H_2 is not limited thereto and may be variously changed.

In this embodiment, the width WH of the through hole 110H_2 may be substantially the same as the above-described separation distances D2, D3, D4, and D5 between the film wirings 133 or may be smaller than the separation distance D2, D3, D4, and D5 between the film wirings 133. However, the relationship between the separation distance between the film wirings 133 and the width of the through hole 110H_2 is not limited thereto and may be variously changed.

Figure 10:
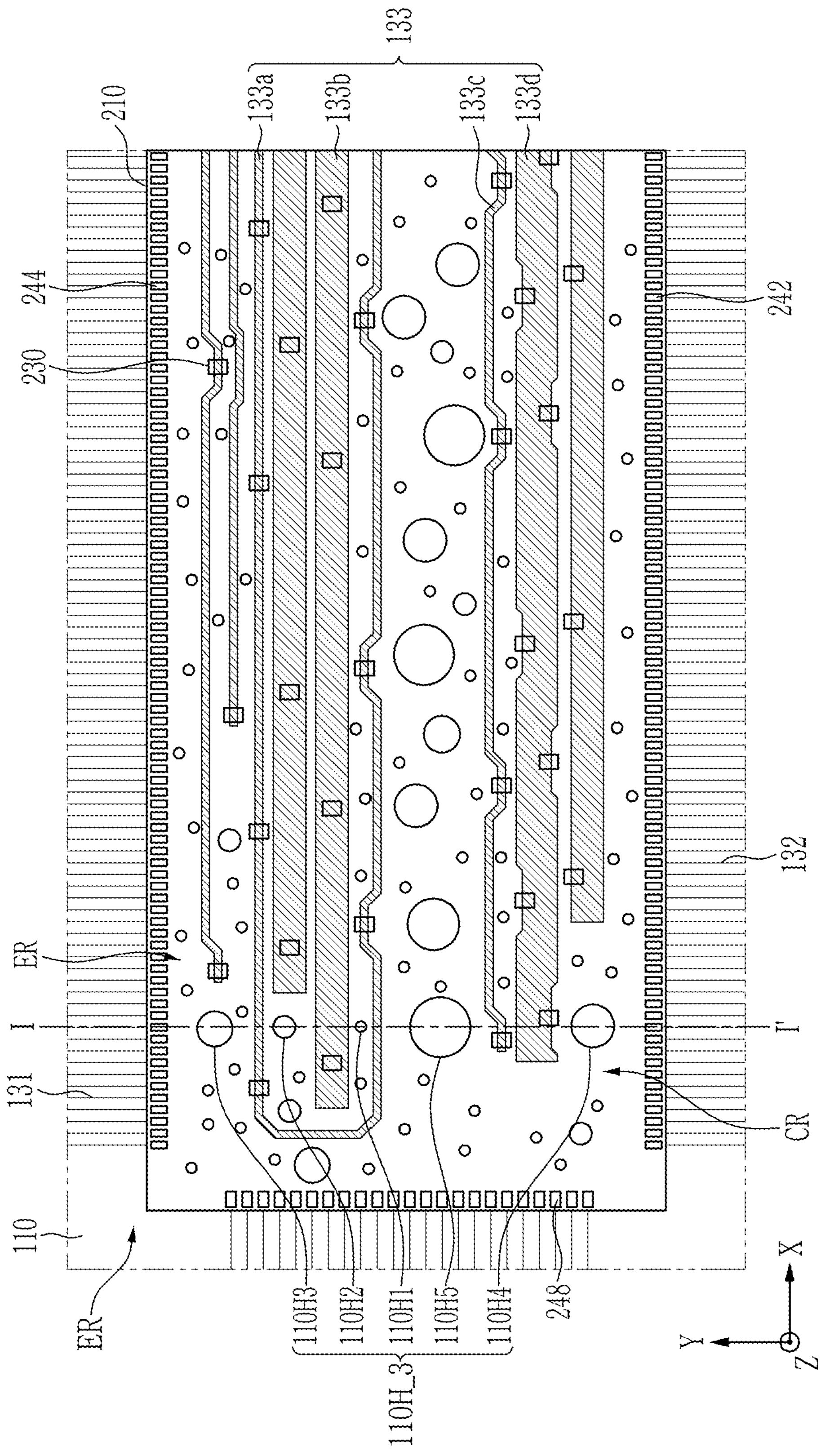
FIG. 10 is a partially enlarged view of a portion of a semiconductor package according to another embodiment.
Figure 11:
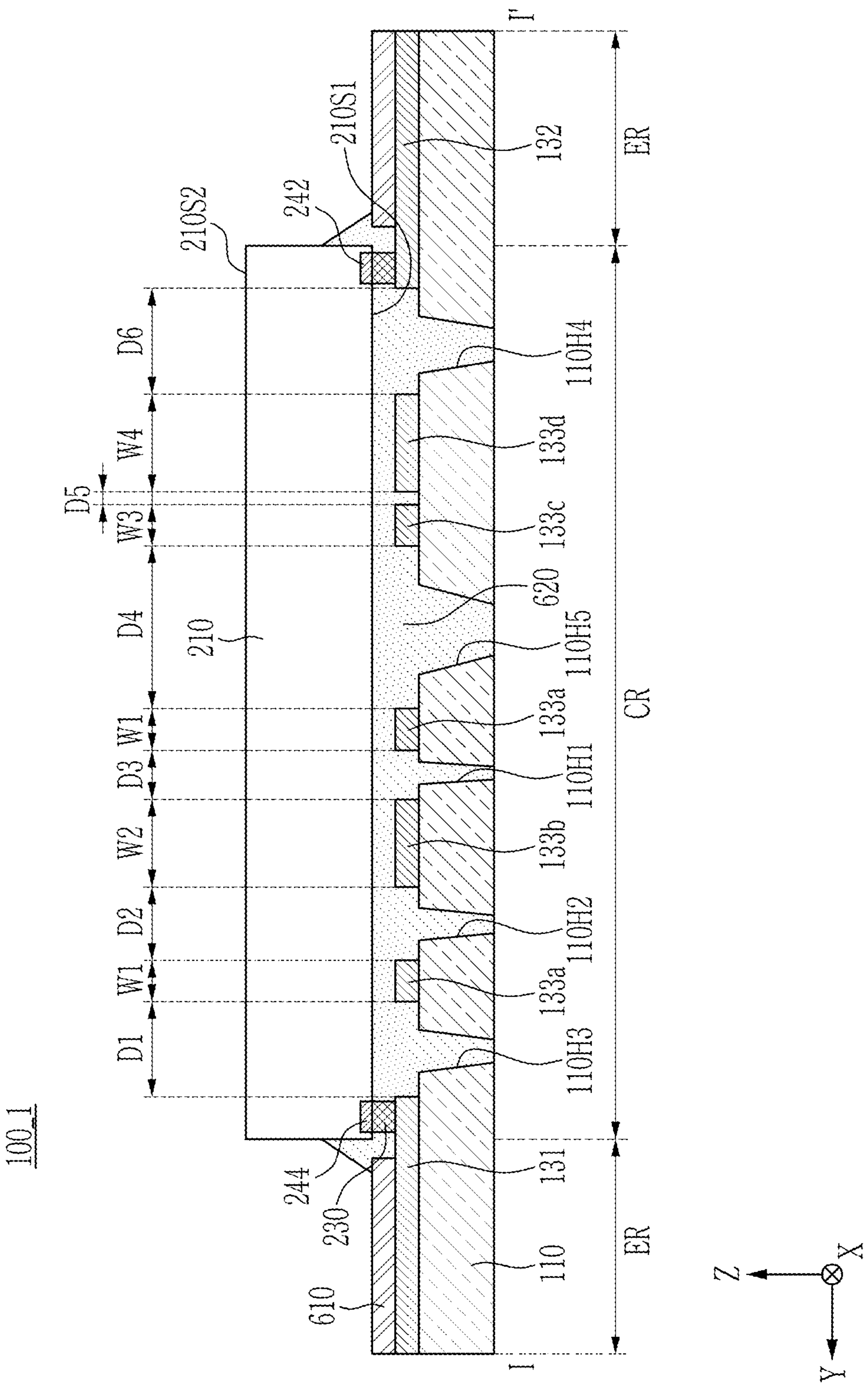
FIG. 11 is a cross-sectional view taken along line I-I' of FIG. 10.

FIG. 10 is a partially enlarged view of a portion of a semiconductor package according to another embodiment. FIG. 11 is a cross-sectional view taken along line I-I' of FIG. 10.

Referring to FIGS. 10 and 11, unlike the embodiment illustrated in FIGS. 5 and 6, there is a difference in that the sizes of the plurality of through holes 110H_3 included in the semiconductor package 100_1 in plan view are different. That is, the through hole 110H_3 according to the embodiment illustrated in FIGS. 10 and 11 may include a plurality of through holes 110H1, 110H2, 110H3, 110H4, and 110H5 having different widths (diameters).

Specifically, in this embodiment, the plurality of through holes 110H_3, in the second direction Y, located between the plurality of film wirings 133 may have different widths. That is, the width of the through hole 110H_3 located between the film wirings 133 having a long separation distance between the film wirings 133 may be greater than the width of the through hole 110H_3 located between the film wirings 133 having a short separation distance between the film wirings 133. In other words, the width of the through hole 110H_3 located in the film substrate 110 having a large area between the film wirings 133 may be greater than the width of the through hole 110H_3 located in the film substrate 110 having a small area between the film wirings 133.

For example, since the separation distance between the first film wiring 133*a* and the third film wiring 133*c*, in the second direction Y, is greater than the separation distance between the first film wiring 133*a* and the second film wiring

133*b*, in the second direction Y, the area of the film substrate 110 between the first film wiring 133*a* and the third film wiring 133*c* may be greater than the area of the film substrate 110 between the first film wiring 133*a* and the second film wiring 133*b*. Accordingly, the widths of the through holes 110H3, 110H4, and 110H5 located between the first film wiring 133*a* and the third film wiring 133*c* may be greater than the widths of the through holes 110H1 and 110H2 located between the first film wiring 133*a* and the second film wiring 133*b*.

In addition, the number of through holes 110H_3 located between the first film wiring 133*a* and the third film wiring 133*c* may be more than the number of through holes 110H_3 located between the first film wiring 133*a* and the second film wiring 133*b*. However, it is not limited thereto, and in some embodiments, as the width of the through holes 110H_3 located between the first film wiring 133*a* and the third film wiring 133*c* increases, the number of through holes 110H_3 located between the first film wiring 133*a* and the third film wiring 133*c* may be smaller than the number of through holes 110H_3 located between the first film wiring 133*a* and the second film wiring 133*b*.

In addition, as the area of the film substrate 110 located between the input wiring 131 and the plurality of film wirings 133 and the area of the film substrate 110 located between the output wiring 132 and the plurality of film wirings 133 each may be different from the area of the film substrate 110 located between the plurality of film wirings 133, the widths of the through holes 110H_3 located between the input wiring 131 and the plurality of film wirings 133 and the widths of the through holes 110H_3 located between the output wiring 132 and the plurality of film wirings 133 may be different from the widths of the through holes 110H_3 located between the plurality of film wirings 133.

For example, the widths of the through holes 110H3 and 110H4, in the second direction Y, located between the input wiring 131 and the plurality of film wirings 133 and between the output wiring 132 and the plurality of film wirings 133, respectively, may be greater than the widths of the through holes 110H1 and 110H2, in the second direction Y, located between the first film wiring 133*a* and the second film wiring 133*b*.

As another example, the widths of the through holes 110H3 and 110H4, in the second direction Y, located between the input wiring 131 and the plurality of film wirings 133 and between the output wiring 132 and the plurality of film wirings 133 may be smaller than the widths of the through hole 110H5, in the second direction Y, located between the first film wiring 133*a* and the third film wiring 133*c*.

In addition, the number of through holes 110H_3 located between the input wiring 131 and the plurality of film wirings 133 and between the output wiring 132 and the plurality of film wirings 133 may be more than the number of through holes 110H_3 located between the first film wirings 133*a* and the second film wirings 133*b*, and may be smaller than the number of through holes 110H_3 located between the first film wiring 133*a* and the third film wiring 133*c*. However, embodiments are not limited thereto, and in some embodiments, as the width of the through holes 110H_3, in the second direction Y, located between the first film wiring 133*a* and the third film wiring 133*c* increases, the number of through holes 110H_3 located between the first film wiring 133*a* and the third film wiring 133*c* may be smaller than the number of through holes 110H_3 located between the input wiring 131 and the plurality of film wirings 133 and between the output wiring 132 and the plurality of film wirings 133

The embodiments of FIGS. 8 to 11 may have substantially the same effect as the semiconductor package 100 according to the embodiment.

Hereinafter, a method of manufacturing a semiconductor package according to an embodiment will be described with reference to FIGS. 12 to 18. The same components described previously are referred to by the same reference numerals, and redundant descriptions will be omitted or simplified, and the differences will be mainly described.

FIGS. 12 to 18 are cross-sectional views for describing intermediate processes in an example method of manufacturing a semiconductor package according to an embodiment.

Specifically, FIGS. 12 to 18 are cross-sectional views sequentially illustrating a method of manufacturing a semiconductor package corresponding to a cross-sectional view taken along line I-I' of FIG. 5.

Figure 12:
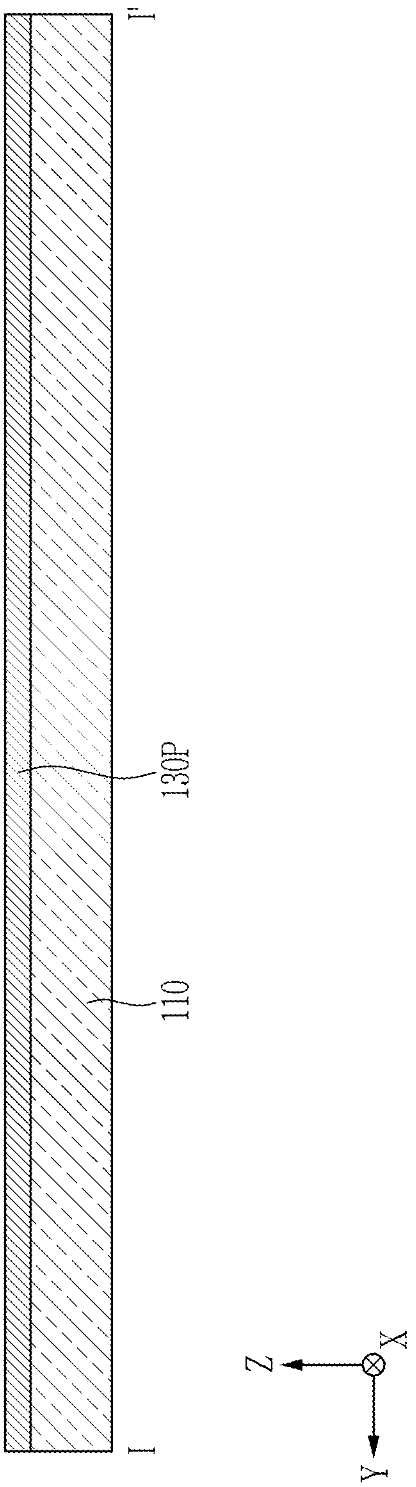
FIGS. 12 to 18 are cross-sectional views for describing a method of manufacturing a semiconductor package according to an embodiment.

First, referring to FIG. 12, a conductive pattern material layer 130P may be formed on a first surface, which may be an upper surface, of the film substrate 110. For example, the conductive pattern material layer 130P may be formed by physical vapor deposition (PVD), chemical vapor deposition (CVD), atomic layer deposition (ALD), or sputtering processes. However, the method of forming a conductive pattern material layer 130P is not limited thereto and may be variously changed.

The film substrate 110 may be a flexible substrate. The film substrate 110 may include an insulating material. For example, film substrate 110 may comprise a resin-based material made of polyimide, polyester, or other known material, and may have flexibility. The conductive pattern material layer 130P may include, for example, copper (Cu) or aluminum (Al). However, the materials included in the film substrate 110 and the conductive pattern material layer 130P are not limited thereto and may be variously changed.

Figure 13:
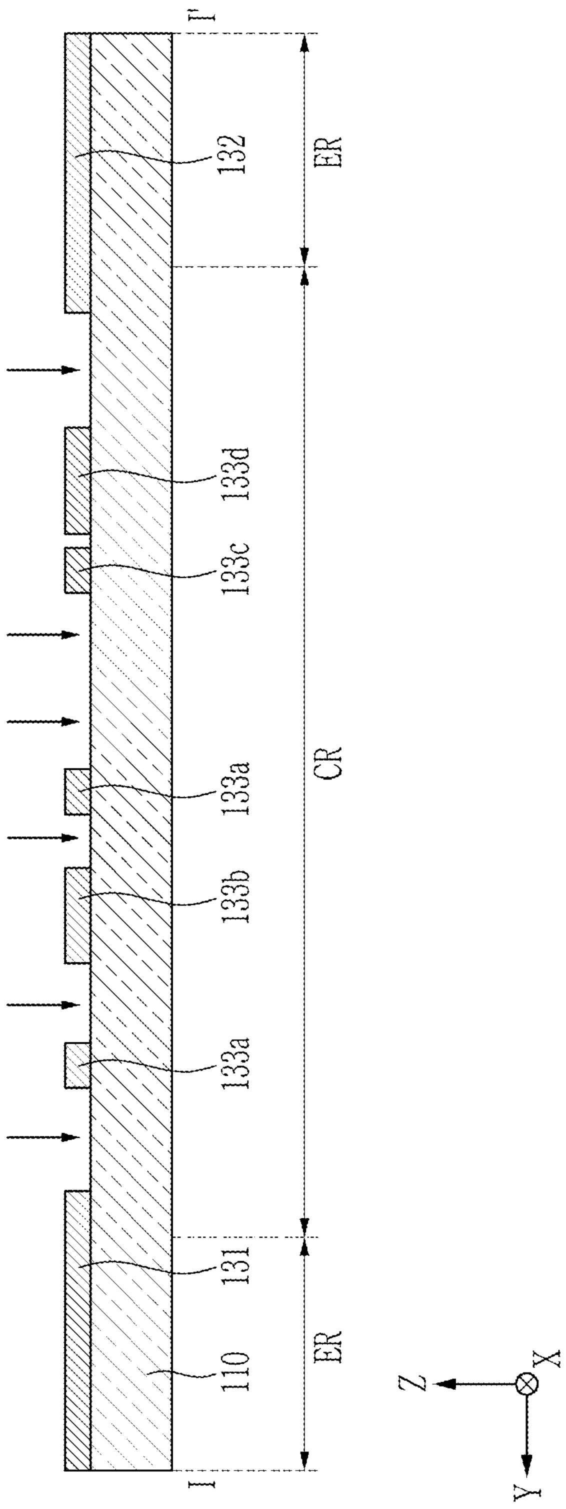

Next, further referring to FIG. 13 together with FIG. 12, the conductive pattern material layer 130P may be patterned to form the input wiring 131 and the output wiring 132 extending from the edge region ER to the chip region CR in the first direction X and/or second direction Y, parallel to the upper surface of the film substrate 110, and the film wirings 133*a*, 133*b*, 133*c*, and 134*b* located in chip region CR.

Specifically, a photomask pattern (not illustrated) may be formed on the conductive pattern material layer 130P to define the chip region CR and the edge region ER, and then the conductive pattern material layer 130P may be patterned using a mask pattern to form the input wiring 131, the output wiring 132, and the film wirings 133*a*, 133*b*, 133*c*, and 133*d*. The photomask pattern may be formed through a process of coating, exposing, and developing a photoresist layer.

In some embodiments, the input wiring 131, the output wiring 132, and the film wirings 133*a*, 133*b*, 133*c*, 133*d* may be formed by patterning the conductive pattern material layer 130P formed on the film substrate 110 using processes such as casting, laminating, or electroplating. However, the method of forming the input wiring 131, the output wiring 132, and the film wirings 133*a*, 133*b*, 133*c*, and 133*d* by patterning the conductive pattern material layer 130P is not limited thereto, and may be variously changed.

Figure 14:
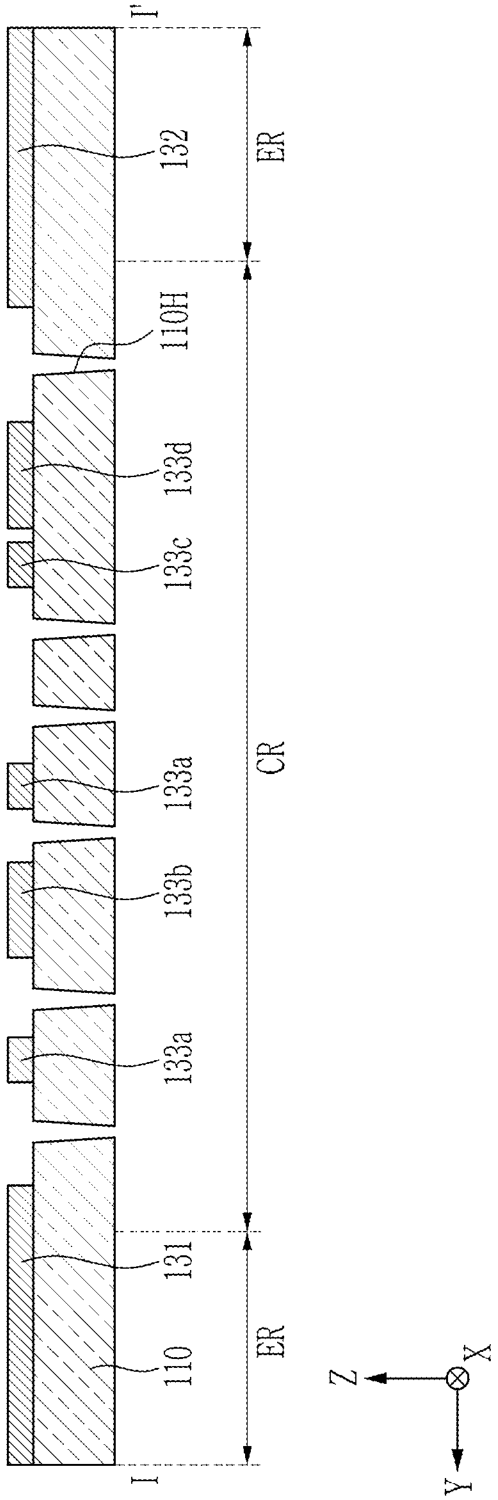

Further referring to FIG. 14 together with FIG. 13, the plurality of through holes 110H penetrating through (i.e., extending into) the film substrate 110 in the third direction Z, which is the vertical direction, may be formed between the input wiring 131 and the first film wiring 133*a*, between the output wiring 132 and the fourth film wiring 133*d*, and between the film wirings 133*a*, 133*b*, 133*c*, and 133*d*. The process of forming the plurality of through holes 110H may be formed through a laser drilling or other etching process, and the method of forming the through holes 110H is not limited thereto and may be variously changed.

Figure 15:
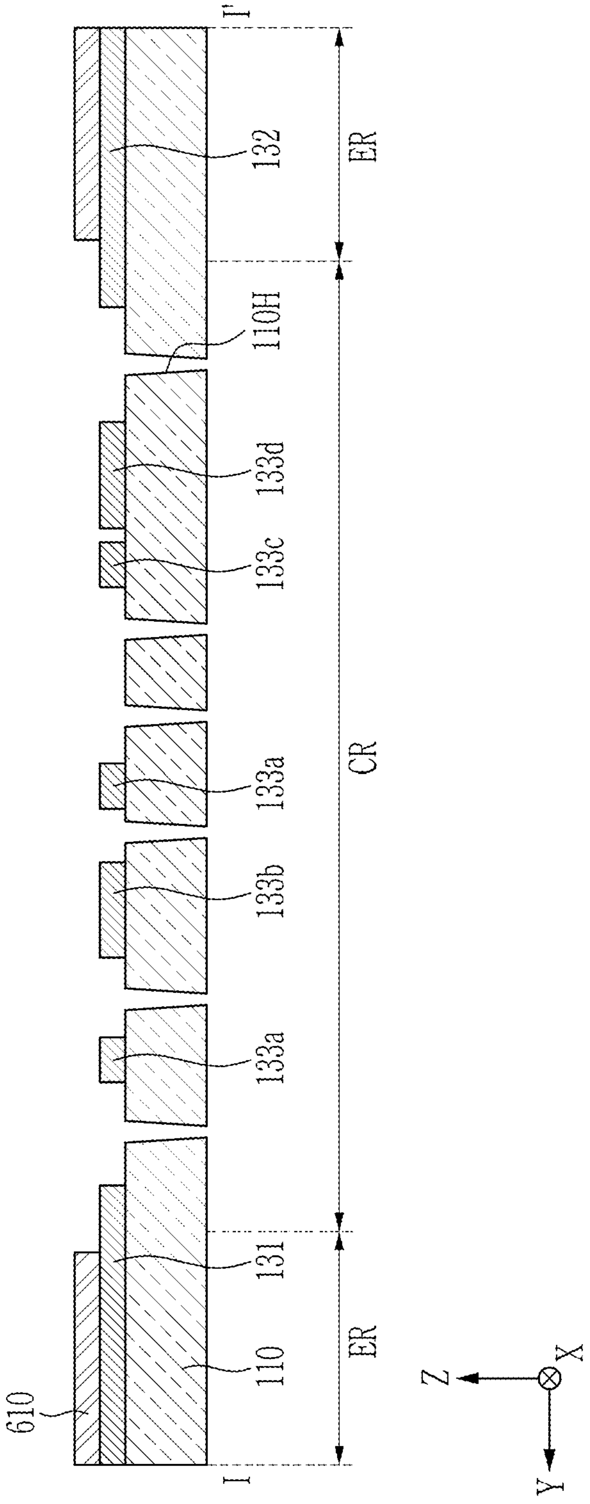

Next, referring to FIG. 15, the passivation layer 610 may be formed on the input wiring 131 and the output wiring 132. The passivation layer 610 may be formed to cover at least a portion of the input wiring 131 and the output wiring 132. The passivation layer 610 may include an insulating material, for example, a solder resist material. However, the arrangement and material of the passivation layer 610 are not limited thereto and may be variously changed.

The passivation layer 610 may be formed by, for example, applying solder mask insulating ink on the upper surface of the film substrate 110, for example by screen printing or inkjet printing, and then curing the solder mask insulating ink with heat, UV, or IR. In some embodiments, the passivation layer 610 may be formed by entirely applying a photo-imageable solder resist on the film substrate 110 by a screen printing method or a spray coating method, or by bonding a film type solder resist material by a laminating method, and then removing unnecessary parts by exposure and development and curing the film type solder resist material with heat, UV, or IR. However, the method of forming the passivation layer 610 is not limited thereto and may be variously changed.

Figure 16:
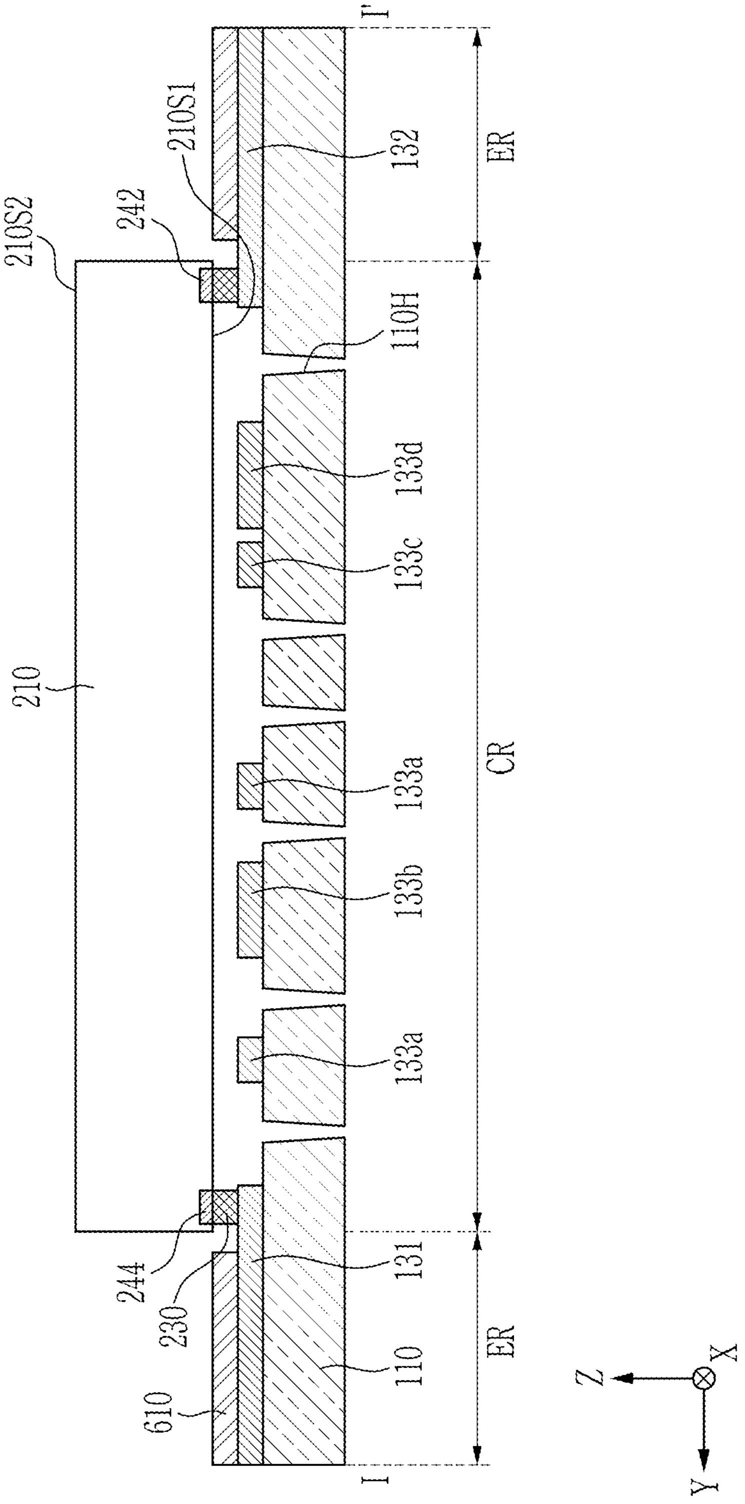

Next, referring to FIG. 16, the semiconductor chip 210 may be attached to the upper surface of the film substrate 110 in a flip-chip connection (i.e., bonding) method so that the lower surface 210S1 of the semiconductor chip 210 faces the upper surface of the film substrate 110. The semiconductor chip 210 may be located in the chip region CR of the film substrate 110. The process of attaching the semiconductor chip 210 may include electrically connecting the input wiring 131 and the output wiring 132 corresponding to the bumps 230 located on the pads 242 and 244, respectively, buried in the semiconductor chip 210.

Figure 17:
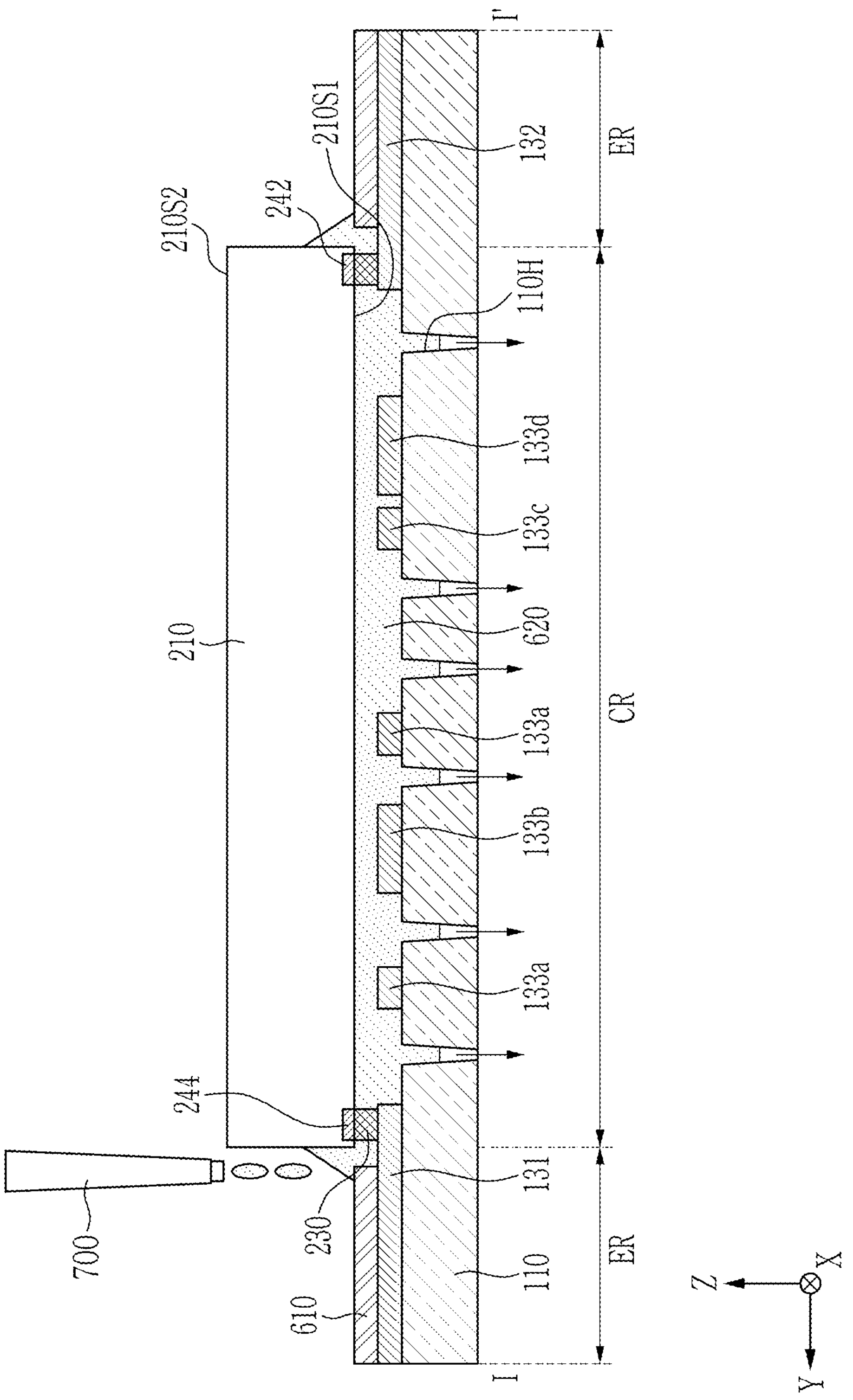
Figure 18:
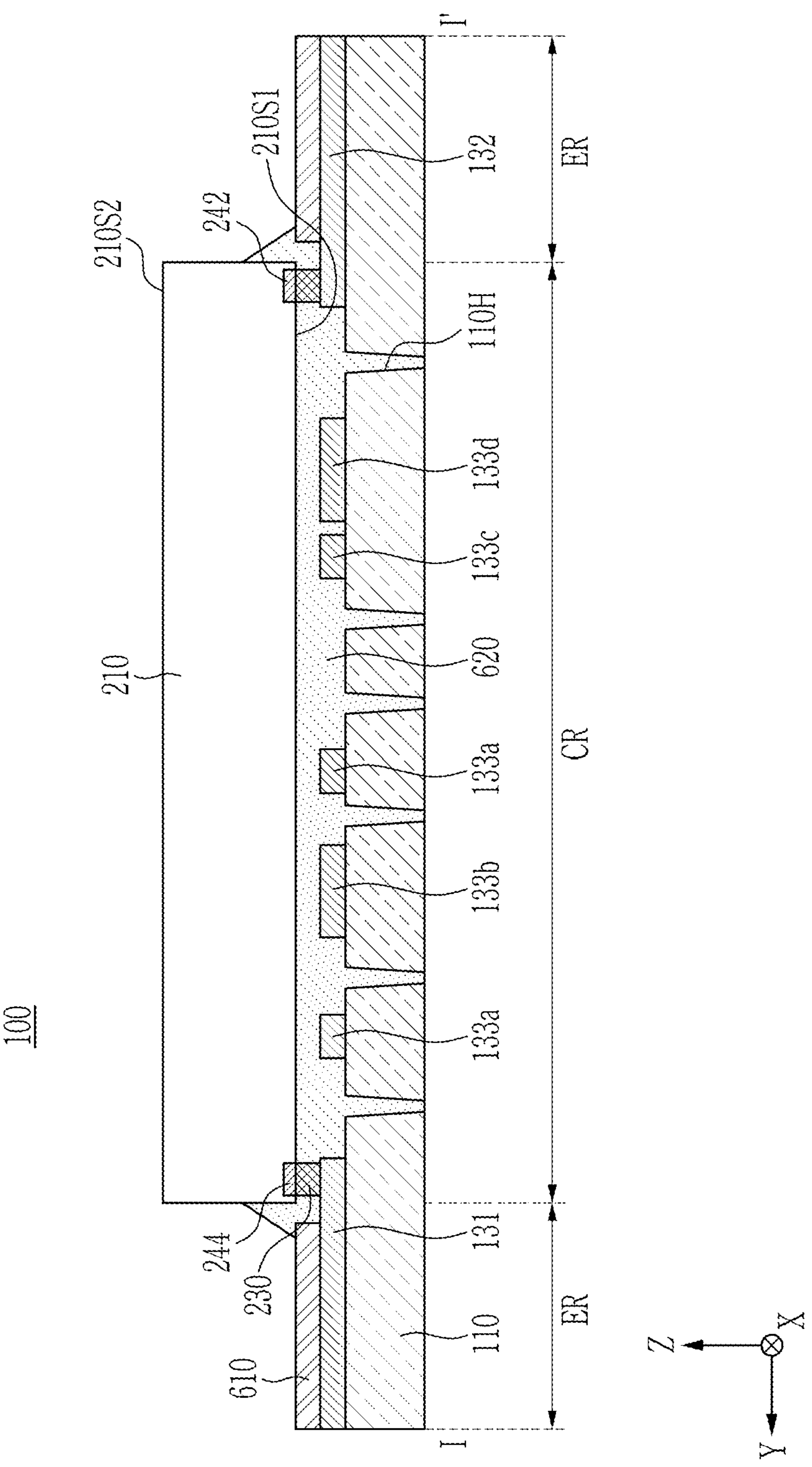

Next, referring to FIGS. 17 and 18, the under-fill layer 620 may be formed to fill the gap region between the film substrate 110 and the semiconductor chip 210, in the third direction Z, through an under-fill layer applicator 700. The under-fill layer 620 may be formed to cover at least a portion of the side surface of the semiconductor chip 210 and at least a portion of the passivation layer 610. The under-fill layer 620 may include an insulating polymer, for example, an epoxy-based polymer. The under-fill layer 620 may be formed by, for example, a capillary under-fill method. However, the method of forming the under-fill layer 620 and the material included in the under-fill layer 620 are not limited thereto and may be variously changed.

The process of forming the under-fill layer 620 may include a process of removing voids partially formed in the under-fill layer 620 using a vacuum suction device (not illustrated).

That is, after connecting the vacuum suction device and the through holes 110H so that air can be evacuated through the through-holes 110H, in the process of forming the under-fill layer 620 using the through hole 110H as an air intake passage, air partially formed in the under-fill layer 620 may be removed. Accordingly, it is possible to suppress voids from being partially formed in the under-fill layer 620 located between the film wirings 133, thereby improving the reliability of the semiconductor package 100.

In the process of removing air partially formed in the under-fill layer 620, the under-fill layer 620 may extend from the upper region toward the lower region of the through hole 110H, and the under-fill layer 620 may fill the inside of the through hole 110H.

According to the method of manufacturing the semiconductor package 100 according to the embodiment, even if the degree of integration of the film wirings 133 increases as the number of film wirings 133 and the line width of the film wirings 133 increase in order to improve the performance of the semiconductor chip 210, it is possible to suppress voids from being formed in the under-fill layer 620 located around the film wirings 133 by the plurality of through holes 110H located between the plurality of film wirings 133, and as a result, it is possible to improve the productivity of the semiconductor package 100 while improving the degree of integration of the film wirings 133 located in the chip region CR.

Although embodiments have been described in detail hereinabove, the scope of the invention is not limited thereto, but may include several modifications and alterations made by those skilled in the art using a basic concept of the invention as defined in the claims.

What is claimed is:

1. A semiconductor package, comprising:

a substrate including a chip region and an edge region extending around the chip region;

a plurality of film wirings on the substrate in the chip region;

an input wiring and an output wiring on the substrate in the edge region and extending to the chip region in a first direction parallel to an upper surface of the substrate; and a semiconductor chip on the substrate in the chip region and electrically connected to the input wiring and the output wiring, wherein the substrate includes a plurality of through holes extending through the substrate in a second direction perpendicular to the first direction, wherein at least one through hole is located between the plurality of film wirings, and wherein one or more through holes of the plurality of through holes are in the chip region of the substrate in a location other than between the plurality of film wirings.

2. The semiconductor package of claim 1, wherein:

a width of the at least one through hole in the first direction decreases as the at least one through hole extends in the second direction from the upper surface of the substrate to a lower surface of the substrate.

3. The semiconductor package of claim 2, wherein:

a side surface of the at least one through hole includes a forward taper inclined surface in a cross-sectional view.

4. The semiconductor package of claim 1, wherein:

an upper width of the at least one through hole has a first width in the first direction, a lower width of the at least one through hole has a second width in the first direction that is smaller than the first width, and a ratio of the second width to the first width is 1:2 to 1:10.

5. The semiconductor package of claim 4, wherein:

the first width is 20 μm to 100 μm.

6. The semiconductor package of claim 4, wherein:

a spacing between adjacent pairs of the plurality of film wirings in the first direction is equal to or greater than the first width.

7. The semiconductor package of claim 6, wherein: the spacing between the adjacent pairs of the plurality of film wirings is 50 μm to 100 μm.

8. The semiconductor package of claim 1, wherein: a width of the at least one through hole in the first direction increases or is constant as the at least one through hole extends in the second direction from the upper surface of the substrate to a lower surface of the substrate.

9. The semiconductor package of claim 1, wherein: a first of the plurality of through holes is between the input wiring and the plurality of film wirings in the first direction, and a second of the plurality of through holes is between the output wiring and the plurality of film wirings in the first direction.

10. A semiconductor package, comprising:

a substrate including a chip region and an edge region extending around the chip region;

a plurality of film wirings on the substrate in the chip region;

an input wiring and an output wiring on the substrate in the edge region and extending to the chip region in a first direction parallel to an upper surface of the substrate;

a semiconductor chip on the substrate in the chip region and electrically connected to the input wiring and the output wiring; and an under-fill layer between the substrate and the semiconductor chip, wherein the substrate includes a plurality of through holes extending through the substrate in a second direction perpendicular to the first direction, the plurality of through holes are between the plurality of film wirings, wherein a number of the plurality of through holes between respective adjacent pairs of the plurality of film wirings is different, and the under-fill layer at least partially fills the plurality of through holes.

11. The semiconductor package of claim 10, wherein: a first of the plurality of through holes is between the input wiring and a first of the plurality of film wirings, and a second of the plurality of through holes is between the output wiring and a second of the plurality of film wirings, and a number of through holes between the input wiring and the first of the plurality of film wirings and between the output wiring and the second of the plurality of film wirings is different from the number of the plurality of through holes between the respective adjacent pairs of the plurality of film wirings.

12. The semiconductor package of claim 10, a width of each of the plurality of through holes in the first direction between the respective adjacent pairs of the plurality of film wirings is the same.

13. The semiconductor package of claim 10, wherein: respective widths of the plurality of through holes in the first direction between the plurality of film wirings are different.

14. The semiconductor package of claim 13, wherein: a first of the plurality of through holes is between the input wiring and a first of the plurality of film wirings, and a second of the plurality of through holes is between the output wiring and a second of the plurality of film wirings, and a first width of the first of the plurality of through holes in the first direction is different from a second width of the second of the plurality of through holes in the first direction.

15. The semiconductor package of claim 13, wherein: a number of the plurality of through holes between respective adjacent pairs of the plurality of film wirings is different.

16. A semiconductor package, comprising:

a substrate including a chip region and an edge region extending around the chip region;

a plurality of film wirings on the substrate in the chip region;

an input wiring and an output wiring on the substrate in the edge region and extending to the chip region in a first direction parallel to an upper surface of the substrate;

a passivation layer on at least a portion of the input wiring and the output wiring;

a semiconductor chip on the substrate in the chip region;

a plurality of conductive bumps between the substrate and the semiconductor chip and electrically connecting the input wiring and the output wiring to the semiconductor chip; and an under-fill layer at least partially filling a gap region between the substrate and the semiconductor chip, wherein the substrate includes a plurality of through holes extending through the substrate in a second direction perpendicular to the first direction, the plurality of through holes are between adjacent pairs of the plurality of film wirings, a width of each of the plurality of through holes in the first direction decreases from the upper surface of the substrate to a lower surface of the substrate, and the under-fill layer is in each of the plurality of through holes.

17. The semiconductor package of claim 16, wherein: at least one of a number of the plurality of through holes between the plurality of film wirings and respective widths of the plurality of through holes in the first direction between the plurality of film wirings is different.

18. The semiconductor package of claim 16, wherein: the plurality of through holes are in the chip region of the substrate other than between the plurality of film wirings.

* * * * *